(12) United States Patent
Iwata et al.

(10) Patent No.: US 7,352,024 B2
(45) Date of Patent: Apr. 1, 2008

(54) SEMICONDUCTOR STORAGE DEVICE AND SEMICONDUCTOR INTEGRATED CIRCUIT

(75) Inventors: Hiroshi Iwata, Nara (JP); Akihide Shibata, Nara (JP); Seizo Kakimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/468,722

(22) PCT Filed: Feb. 21, 2002

(86) PCT No.: PCT/JP02/01514
§ 371 (c)(1),
(2), (4) Date: Oct. 22, 2003

(87) PCT Pub. No.: WO02/067320
PCT Pub. Date: Aug. 29, 2002

(65) Prior Publication Data
US 2004/0108512 A1   Jun. 10, 2004

(30) Foreign Application Priority Data
Feb. 22, 2001 (JP) ............................. 2001-046451
May 22, 2001 (JP) ............................. 2001-152524

(51) Int. Cl.
*H01L 29/788* (2006.01)
*H01L 29/792* (2006.01)
(52) U.S. Cl. ...................... 257/314; 257/315; 257/324; 257/E29.3; 257/E29.309; 257/325
(58) Field of Classification Search ........ 257/314–316, 257/318, 321, 324–326, E29.152, E29.3, 257/E29.309; 365/185.26, 185.17; 438/304, 438/267
See application file for complete search history.

(56) References Cited

U.S. PATENT DOCUMENTS 4,870,470 A * 9/1989 Bass et al. ................ 257/324
4,881,108 A   11/1989 Yoshikawa
(Continued)

FOREIGN PATENT DOCUMENTS

EP          0 311 773 A2    4/1989
(Continued)

*Primary Examiner*—Matthew C. Landau
(74) *Attorney, Agent, or Firm*—Birch, Stewart, Kolasch & Birch, LLP

(57) ABSTRACT

There is provided a semiconductor storage device capable of high integration. On a top surface of a semiconductor substrate, a plurality of device isolation regions (16) each extending and meandering in a lateral direction are formed so as to be arrayed with respect to a longitudinal direction, by which active regions are defined between neighboring ones of the device isolation regions (16), respectively. Dopant diffusion regions (source or drain) are formed at individual turnover portions (corresponding to contacts (14), (15)), respectively, of the meanders within the active regions. A plurality of word lines (11) extending straight in the longitudinal direction run on the channel regions within the active regions via a film having memory function, respectively. A first bit line (12) extending straight in the lateral direction runs on the dopant diffusion region (corresponding to contact (14)) provided at a crest-side turnover portion. A second bit line (15) extending straight in the lateral direction runs on the dopant diffusion region (corresponding to contact (15)) provided at a trough-side turnover portion.

5 Claims, 28 Drawing Sheets

U.S. PATENT DOCUMENTS

| | | | |
|---|---|---|---|
| 5,051,793 A * | 9/1991 | Wang | 257/316 |
| 5,325,327 A * | 6/1994 | Ema | 365/185.05 |
| 5,408,115 A * | 4/1995 | Chang | 257/324 |
| 5,451,803 A | 9/1995 | Oji et al. | |
| 5,838,041 A * | 11/1998 | Sakagami et al. | 257/324 |
| 5,999,444 A * | 12/1999 | Fujiwara et al. | 365/185.02 |
| 6,198,658 B1 * | 3/2001 | Yoon et al. | 365/185.05 |
| 6,441,427 B1 * | 8/2002 | Yamada et al. | 257/315 |
| 6,630,707 B1 * | 10/2003 | Shinmori | 257/315 |

FOREIGN PATENT DOCUMENTS

| | | |
|---|---|---|
| EP | 0 471 381 A2 | 2/1992 |
| EP | 0 502 438 A2 | 9/1992 |
| EP | 0 590 319 A2 | 4/1994 |
| JP | 63-237580 A | 10/1988 |
| JP | 2-23595 A | 1/1990 |
| JP | 6-177392 A | 6/1994 |
| JP | 10-308097 A | 11/1998 |
| JP | 11-87544 A | 3/1999 |

* cited by examiner

SEMICONDUCTOR STORAGE DEVICE AND SEMICONDUCTOR INTEGRATED CIRCUIT

This application is the national phase under 35 U.S.C. § 371 of PCT International Application No. PCT/JP02/01514 which has an International filing date of Feb. 21, 2002, which designated the United States of America.

TECHNICAL FIELD

The present invention relates to a semiconductor storage device formed of field effect transistor (FET) type memory cells equipped with memory-functional film, and to a semiconductor integrated circuit including the semiconductor storage device.

BACKGROUND ART

Flash memory has been widely used as a memory using threshold changes of MOS (Metal Oxide Semiconductor) FETs due to the charge amount of the floating gate that is the memory-functional film. Among 1-transistor type memories of the flash memory are NOR type, DINOR type, NAND type, AND type, and the like. Among them, the AND type has a characteristic that it can be made smaller in cell area and still equivalent in read speed, compared with the NOR type. Further, the AND type is enabled to perform erase operations on the word line basis, thus having a characteristic that it is smaller in erase unit than the NAND type.

However, in the above-described conventional AND type memory, the cell area is about $8F^2$ (where F is a minimum machining pitch), larger than $6F^2$ of the NAND type memory, which has been an obstacle to higher integration as a problem.

A detailed explanation is given below. FIG. 32 shows a planar pattern layout in the conventional AND type memory cell array. Referring to FIG. 32, in the conventional AND type cell array, a plurality of device isolation regions 1 for partitioning the semiconductor substrate are formed so as to extend straight in one direction (lateral direction in FIG. 32). The pitch of the device isolation regions 1 along the longitudinal direction is set to 4F. Between one pair of device isolation regions 1, 1, a source line 2 and a bit line 3 each composed of a dopant diffusion layer in the semiconductor substrate are formed so as to extend straight in the lateral direction and to be spaced from each other by a distance of 1F. On the other hand, in the vertical direction (longitudinal direction in FIG. 32) against the lateral direction, a plurality of word lines 4 composed of polycrystalline silicon are formed so as to extend straight at a pitch of 2F in the lateral direction. Then, a region interposed between the source line 2 and the bit line 3 and covered with a word line 4 becomes a channel region 5. One memory cell is a region represented by a longitudinally 4F and laterally 2F sized rectangular shape 6 depicted by two-dot chain line in FIG. 32, the area thereof being $8F^2$ (=4F×2F) larger than that of the NAND type memory, $6F^2$.

As shown above, the AND type memory, although having such characteristics as the read speed equivalent to that of the NOR type and the capability of word-line basis erase operation, which is smaller than in the NAND type, yet has the problems of larger area and incapability of higher integration as compared with the NAND type.

DISCLOSURE OF THE INVENTION

Technical Issues to be Solved by the Invention

Accordingly, an object of the present invention is to provide a semiconductor storage device smaller in one-memory cell area and higher in feasible integration than those of the NAND type, as well as to provide a semiconductor integrated circuit having the semiconductor storage device.

In order to achieve the above object, in a first aspect of the present invention, there is provided a semiconductor storage device characterized in that:

on a top surface of a semiconductor substrate, device isolation regions each extending and meandering in one direction are formed so as to be arrayed with respect to a direction vertical to the one direction, and active regions each extending in the one direction are defined between neighboring ones of the device isolation regions, respectively;

dopant diffusion regions each serving as a source region or drain region are formed at individual turnover portions, respectively, of meanders within the active regions, and channel regions are defined between neighboring ones of the dopant diffusion regions within identical active regions, respectively;

on the semiconductor substrate, word lines extending in intersection with the one direction are provided so as to run on the channel regions provided within the active regions; and on the semiconductor substrate, a plurality of bit lines extending in the one direction are provided so as to run on the dopant diffusion regions, and are also connected to the dopant diffusion regions present thereunder via contact holes, respectively.

In this constitution, not that the dopant diffusion layer in the semiconductor substrate is taken as bit lines as has been in the prior art, but that bit lines are formed on the semiconductor substrate and connected to the dopant diffusion regions (source region or drain region) present thereunder via contact holes. Also, the active regions are meandering, and the dopant diffusion regions are formed at individual turnover portions of the meanders. Therefore, it becomes implementable that a plurality of bit lines or a bit line and a plate electrode are provided on an identical active region and moreover each connected to the source region or drain region. Further, the dopant diffusion regions formed at individual turnover portions of the meanders within the active regions, respectively, are each paired with a dopant diffusion region neighboring within the same active region via the channel region, thus serving as a source region/drain region of the field effect transistor. That is, the dopant diffusion regions are shared each by two field effect transistors. Therefore, the device area can be reduced.

From the above reasons, according to the semiconductor storage device of this embodiment, the area of one cell can be made smaller than that of the conventional AND type memory cell array. Therefore, higher integration becomes implementable, the product yield improves, and the manufacturing cost can be reduced.

In an embodiment, the plurality of bit lines comprise a first bit line provided so as to run on the dopant diffusion region provided at a one-side turnover portion of the meander within an identical active region, and a second bit line provided so as to run on the dopant diffusion region provided at the other-side turnover portion of the meander within the identical active region.

In this embodiment, within the identical active region, the first bit line is provided on the dopant. diffusion region provided at a one-side turnover portion of the meander, while the second bit line is provided on the dopant diffusion region provided at the other-side turnover portion of the meander, where the individual bit lines and the dopant diffusion regions present thereunder are connected to each other via contact holes, respectively. Therefore, each dopant region connected to the first bit line can be assigned to serve as one of the source region and the drain region, while each dopant region connected to the second bit line can be assigned to serve as the other of the source region and the drain region. Further, in the planar pattern layout, there is no need for any margin that isolates the first bit line and the second bit line from each other, and the first bit lines (second bit lines) can be arrayed at a pitch of 2F in a direction intersecting with the one direction. Thus, the area of one cell can be further reduced, for example, to $4F^2$.

Furthermore, the source region and the drain region can be given voltages that are independent from bit line to bit line. Therefore, for example, with the use of a silicon nitride film as the charge-trapping film, it becomes implementable to store 2-bit information by one transistor when the source region and the drain region are functionally replaced with each other.

In one embodiment, the first bit line and the second bit line are formed of different interconnect layers electrically isolated by an interlayer insulator, respectively.

In this embodiment, the first bit line and the second bit line are formed of different interconnect layers that differ in height from the semiconductor substrate from each other. Therefore, even if there is no margin for isolating the first bit line and the second bit line from each other on the planar pattern layout, the isolation between the first bit line and the second bit line can be easily achieved.

In one embodiment, the plurality of bit lines are alternately connected to the dopant diffusion regions present thereunder via contact holes, respectively; and plate electrodes are connected to dopant diffusion regions to which the plurality of bit lines are not connected.

In this embodiment, one of the source region and the drain region is connected to the bit line, and the other one of the source region and the drain region is connected to the plate electrode. That is, only one bit line is present on the identical active region.

Therefore, as compared to the case where a plurality of bit lines are provided on the identical active region, the semiconductor storage device is simpler in interconnect structure, thus being easier to manufacture. Further, since the plate electrode has only to be given a constant voltage at all times as an example, the circuit for driving the memory can be simplified so that higher integration of the semiconductor storage device as well as its cost reduction are achieved.

In one embodiment, a film having memory function is present between gate electrode forming part of the word line and channel region.

In this embodiment, by applying a potential difference to between the gate electrode and the channel region or the source/drain region, rewrite operation can be easily performed on the film having memory function. The film having memory function also has a function as a gate insulator, so that stored information can be easily detected as changes in the threshold of the field effect transistor.

In one embodiment, a film having memory function is present on a side wall of the gate electrode forming part of the word line.

In this embodiment, since a film having memory function is provided on the side wall of the gate electrode, the gate insulator does not need to have the memory effect, thus being easily formed into a thinner film. As a result, the short-channel effect can be easily suppressed. Further, the film having memory function is separated effectively, so that 2-bit operation can be easily implemented. Therefore, micro-finer implementation and cost reduction of the semiconductor storage device is achieved.

Also, in a second aspect of the present invention, there is provided a semiconductor storage device characterized in that:

on a top surface of a semiconductor substrate, device isolation regions each extending in one direction are formed so as to be arrayed with respect to a direction vertical to the one direction, and active regions each extending in the one direction are defined between neighboring ones of the device isolation regions, respectively;

dopant diffusion regions each serving as a source region or drain region are formed within the active regions, and channel regions are defined between neighboring ones of the dopant diffusion regions within identical active regions, respectively;

on the semiconductor substrate, a plurality of word lines extending in intersection with the one direction are provided so as to run on the channel regions provided within the active regions;

on the semiconductor substrate, a plurality of bit lines extending in the one direction are provided so as to run on the dopant diffusion regions, and are also connected to the dopant diffusion regions present thereunder via contact holes, respectively; and the semiconductor substrate has a well region on its top surface side, the well region being electrically partitioned by the device isolation regions to form third bit lines.

In this constitution, not that the dopant diffusion layer in the semiconductor substrate is taken as bit lines as has been in the prior art, but that bit lines are formed on the semiconductor substrate and connected to the dopant diffusion regions (source region or drain region) present thereunder via contact holes. Therefore, it becomes implementable that a plurality of bit lines or a bit line and a plate electrode are provided on an identical active region and moreover each connected to the source region or drain region. The well region electrically partitioned by the device isolation regions serves as a third bit line. During the operation of the semiconductor storage device, by selecting specific ones out of a plurality of third bit lines, applied voltage is variable on the third-bit-line basis, i.e., on the well region basis. Therefore, by applying proper voltages to the bit lines and the third bit lines, rewrite operation on the 1-bit basis becomes implementable. Thus, a semiconductor storage device capable of random access is offered.

In one embodiment, the plurality of bit lines comprise a first bit line connected to one of the source region or the drain region, and a second bit line connected to the other one of the source region or the drain region.

In this embodiment, the source region and the drain region can be given voltages that are independent from bit line to bit line. Therefore, for example, with the use of a silicon nitride film as the charge-trapping film, it becomes implementable to store 2-bit information by one transistor when the source region and the drain region are functionally replaced with each other.

Also, in a third aspect of the present invention, there is provided a semiconductor storage device characterized in that:

on a top surface of a semiconductor substrate, device isolation regions each extending and meandering in one direction are formed so as to be arrayed with respect to a direction vertical to the one direction, and active regions each extending in the one direction are defined between neighboring ones of the device isolation regions, respectively;

dopant diffusion regions each serving as a source region or drain region are formed at individual turnover portions, respectively, of meanders within the active regions, and channel regions are defined between neighboring ones of the dopant diffusion regions within identical active regions, respectively;

on the semiconductor substrate, a plurality of word lines extending in intersection with the one direction are provided so as to run on the channel regions provided within the active regions;

on the semiconductor substrate, a plurality of bit lines extending in the one direction are provided so as to run on the dopant diffusion regions, and are also connected to the dopant diffusion regions present thereunder via contact holes, respectively; and the semiconductor substrate has a well region on its top surface side, the well region being electrically partitioned by the device isolation regions to form third bit lines.

With this constitution, also, working effects similar to those of the semiconductor storage device of the second aspect are produced. Furthermore, the active regions are meandering, and the dopant diffusion regions are formed at individual turnover portions of the meanders. Therefore, it becomes implementable that a plurality of bit lines or a bit line and a plate electrode are provided on an identical active region and moreover each connected to the source region or drain region. Further, the dopant diffusion regions formed at individual turnover portions of the meanders within the active regions, respectively, are each paired with a dopant diffusion region neighboring within the same active region via the channel region, thus serving as a source region/drain region of the field effect transistor. That is, the dopant diffusion regions are shared each by two field effect transistors. Therefore, the device area can be reduced.

Consequently, according to the semiconductor storage device of the third aspect, high integration and random access are implementable.

In one embodiment, the plurality of bit lines comprise a first bit line provided so as to run on the dopant diffusion region provided at a one-side turnover portion of the meander within an identical active region, and a second bit line provided so as to run on the dopant diffusion region provided at the other-side turnover portion of the meander within the identical active region.

In this embodiment, within the identical active region, the first bit line is provided on the dopant diffusion region provided at a one-side turnover portion of the meander, while the second bit line is provided on the dopant diffusion region provided at the other-side turnover portion of the meander, where the individual bit lines and the dopant diffusion regions present thereunder are connected to each other via contact holes, respectively. Therefore, each dopant region connected to the first bit line can be assigned to serve as one of the source region and the drain region, while each dopant region connected to the second bit line can be assigned to serve as the other of the source region and the drain region. Further, in the planar pattern layout, there is no need for any margin that isolates the first bit line and the second bit line from each other, and the first bit lines (second bit lines) can be arrayed at a pitch of 2F in a direction intersecting with the one direction. Thus, the area of one cell can be further reduced, for example, to $4F^2$.

Furthermore, the source region and the drain region can be given voltages that are independent from bit line to bit line. Therefore, for example, with the use of a silicon nitride film as the charge-trapping film, it becomes implementable to store 2-bit information by one transistor when the source region and the drain region are functionally replaced with each other.

In one embodiment, the first bit line and the second bit line are formed of different interconnect layers electrically isolated by an interlayer insulator, respectively.

In this embodiment, the first bit line and the second bit line are formed of different interconnect layers that differ in height from the semiconductor substrate from each other. Therefore, even if there is no margin for isolating the first bit line and the second bit line from each other on the planar pattern layout, the isolation between the first bit line and the second bit line can be easily achieved.

In one embodiment, the plurality of bit lines are alternately connected to the dopant diffusion regions present thereunder via contact holes, respectively; and plate electrodes are connected to dopant diffusion regions to which the plurality of bit lines are not connected.

In this embodiment, one of the source region and the drain region is connected to the bit line, and the other one of the source region and the drain region is connected to the plate electrode. That is, only one bit line is present on the identical active region.

Therefore, as compared to the case where a plurality of bit lines are provided on the identical active region, the semiconductor storage device is simpler in interconnect structure, thus being easier to manufacture. Further, since the plate electrode has only to be given a constant voltage at all times as an example, the circuit for driving the memory can be simplified so that higher integration of the semiconductor storage device as well as its cost reduction are achieved.

In one embodiment, a film having memory function is present between gate electrode forming part of the word line and channel region.

In this embodiment, by applying a potential difference to between the gate electrode and the channel region or the source/drain region, rewrite operation can be easily performed on the film having memory function. The film having memory function also has a function as a gate insulator, so that stored information can be easily detected as changes in the threshold of the field effect transistor.

In one embodiment, a film having memory function is present on a side wall of the gate electrode forming part of the word line.

In this embodiment, since a film having memory function is provided on the side wall of the gate electrode, the gate insulator does not need to have the memory effect, thus being easily formed into a thinner film. As a result, the short-channel effect can be easily suppressed. Further, the film having memory function is separated effectively, so that 2-bit operation can be easily implemented. Therefore, micro-finer implementation and cost reduction of the semiconductor storage device is achieved.

In one embodiment, the film having memory function is a dielectric film containing fine particles formed of a semiconductor or conductor in a dot form.

In this specification, the term "fine particles" refers to particles having a size of the nanometer (nm) order.

In this embodiment, since the film having memory function is a dielectric film containing fine particles formed of a semiconductor or conductor in a dot form, the storage leakage is reduced. Therefore, device reliability can be improved. Further, since electric charges are accumulated within the dot-form fine particles, the semiconductor storage device is suited to the mode of 2-bit by 1-transistor.

In one embodiment, the film having memory function is a multilayered film of a silicon nitride film and a silicon oxide film.

In this embodiment, since the film having memory function is a multilayered film of a silicon nitride film and a silicon oxide film, the film has a function of trapping electric charges. Therefore, the leakage of storage charges is reduced. Thus, device reliability can be improved. Further, since the electric charges are accumulated locally within the silicon nitride film, the semiconductor storage device is suited to the mode of 2-bit by 1-transistor.

In one embodiment, the film having memory function is so structured that a silicon nitride film is sandwiched by silicon oxide films.

In this embodiment, since the film having memory function is so structured that a silicon nitride film is sandwiched by silicon oxide films, injected storage charges can effectively be trapped. Therefore, the memory-film performance can be further improved.

In one embodiment, the film having memory function is so structured that a silicon film is sandwiched by silicon oxide films.

In this embodiment, since the film having memory function is so structured that a silicon film is sandwiched by silicon oxide films, there is an advantage that manufacturing process similar to that for flash memory can be used. Thus, a memory cell of small area can be implemented by a manufacturing process of established reliability.

In one embodiment, the silicon film is formed of polysilicon.

In this embodiment, since the silicon film is formed of polysilicon, the silicon film can be formed by ordinary LPCVD equipment. Thus, a memory cell of small area can be implemented relatively simply.

In one embodiment, part of the word line present on the channel region forms a gate electrode.

In this embodiment, since part of the word line present on the channel region forms a gate electrode, there is no need for using any contact or upper interconnection to connect the gate electrode and the word line to each other. Therefore, the structure of the memory cell is simplified, so that the manufacturing process can be reduced. Thus, the manufacturing cost can be lowered.

In one embodiment, in a write operation or an erase operation, in a selected memory cell, if an absolute value of a potential difference between the word line and the bit line, or an absolute value of a potential difference between the word line and the first bit line, or an absolute value of a potential difference between the word line and the second bit line, or an absolute value of a potential difference between the word line and the third bit line, is $V_{DD}$, then a relationship that $V_{DD}/3 \leq V < V_{DD}/2$ is satisfied with respect to a memory cell connected to only either one of a selected word line and a selected bit line, where V represents a voltage applied to a memory-function film of the memory cell which is non-selected.

The ratio of the voltage applied to the selected memory cell to the maximum value of voltages applied to the non-selected memory cells becomes a large one. Therefore, a memory of large operational margin is implemented.

Furthermore, in a fourth aspect of the present invention, there is provided a semiconductor integrated circuit in which the semiconductor storage device according to any one of the first to third aspects of the present invention and a logic circuit are compositely mounted.

With this constitution, it becomes implementable, for example, to write a large-scale program temporarily, hold the program even after the turn-off of power, and execute the program also after the reentry of power. Thus, functional improvement becomes achievable.

BEST MODE FOR CARRYING OUT THE INVENTION

Hereinbelow, the present invention is described in detail by way of embodiments thereof illustrated in the accompanying drawings. The semiconductor substrate to which the present invention can be applied, although not particularly limited, is preferably given by a silicon substrate. Also, the semiconductor substrate may have P or N conductive type. It is noted that each of the following embodiments show a case where a silicon substrate is used. Even with an N-type or P-type silicon substrate used, similar semiconductor storage devices of similar functions can be formed by similar processes. Furthermore, although each of the following embodiments is described on a case where an N-type device is used as a memory, a P-type device may be used as a memory without any problem. In that case, the conductive type of injection dopants may appropriately be inverted in all cases.

First Embodiment

This embodiment is explained as follows with reference to FIGS. 1 to 5.

Figure 1:
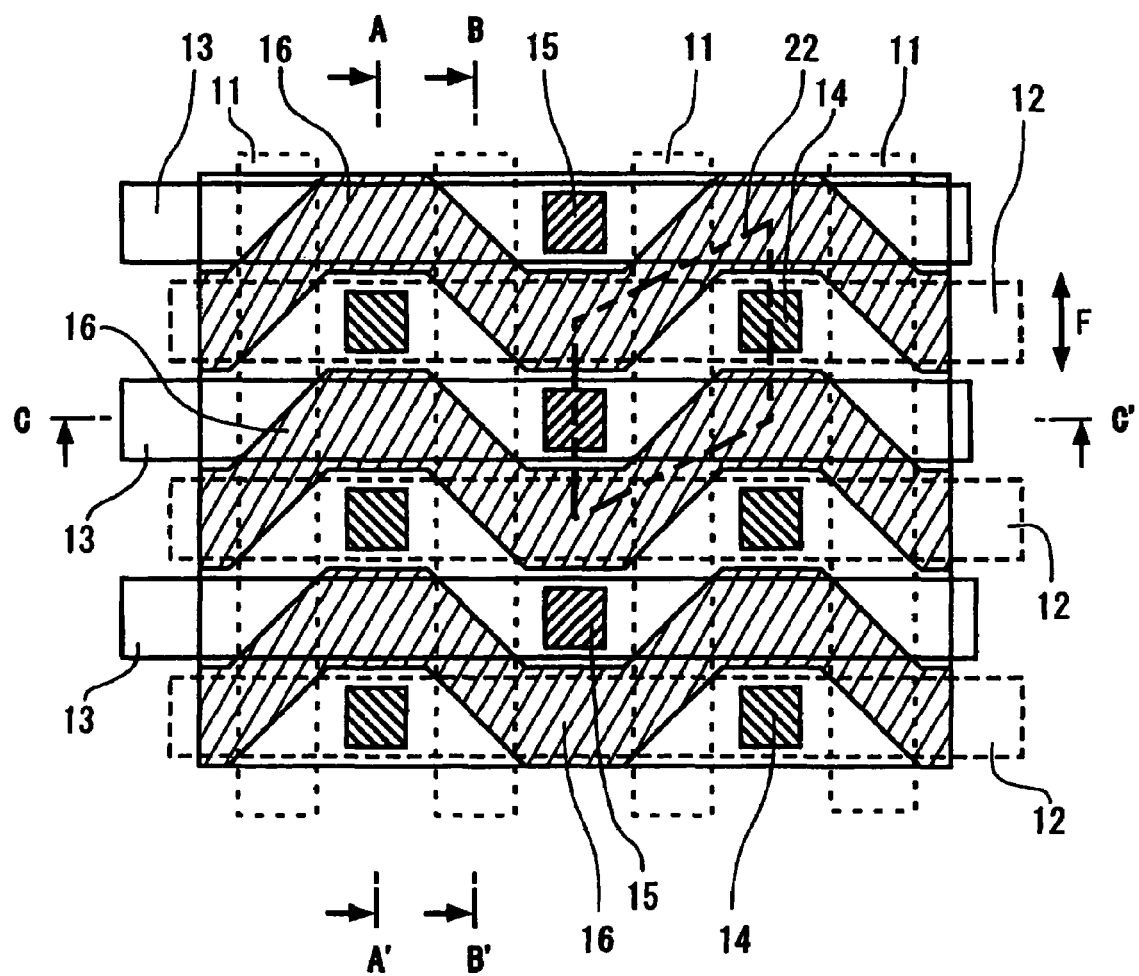
FIG. 1 is a view showing the planar pattern of a first embodiment of a semiconductor storage device of the invention.
Figure 2:
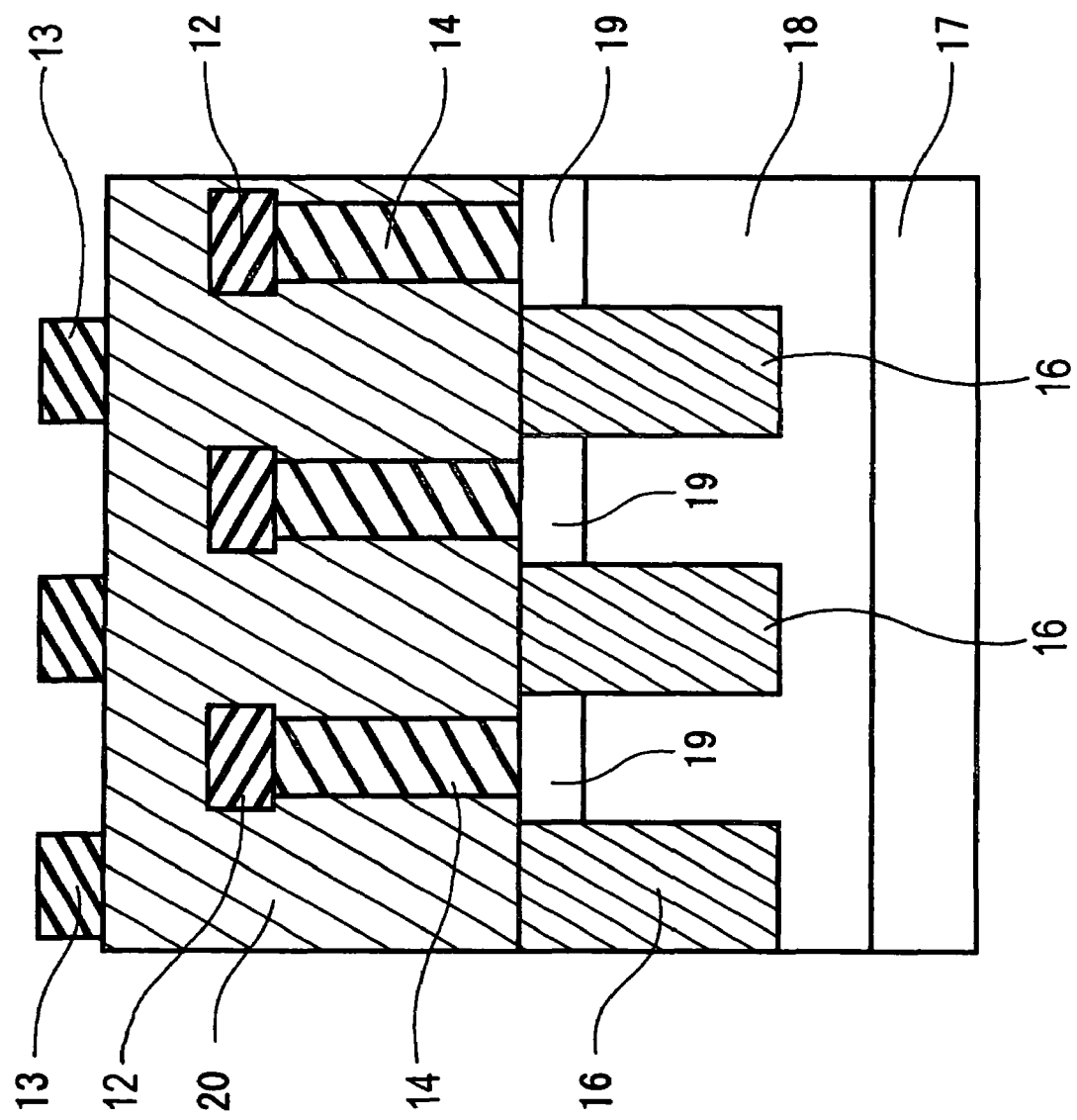
FIG. 2 is a sectional view taken in the direction of arrows along the line A-A' of FIG. 1.
Figure 3:
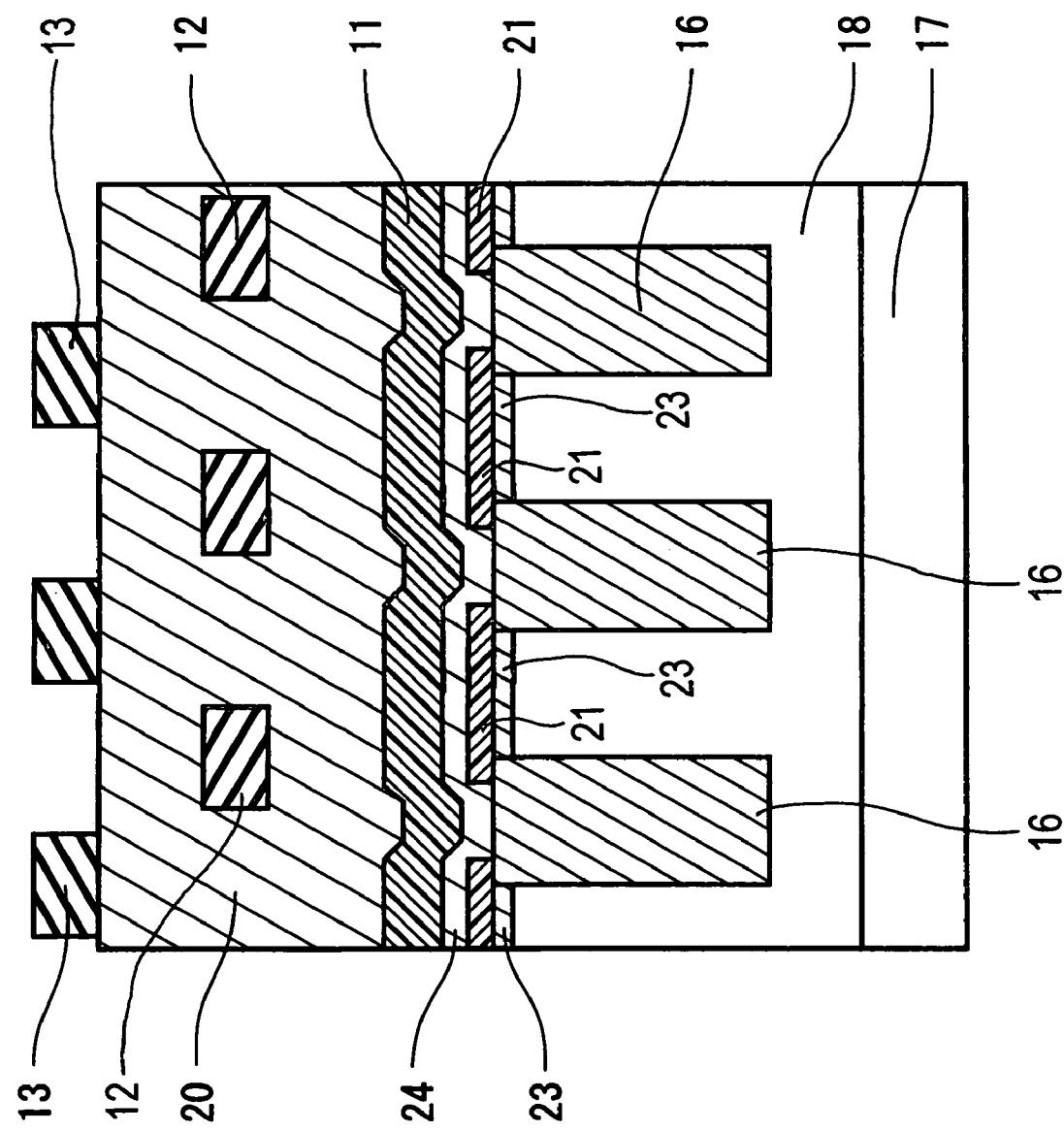
FIG. 3 is a sectional view taken in the direction of arrows B-B' of FIG. 1.
Figure 4:
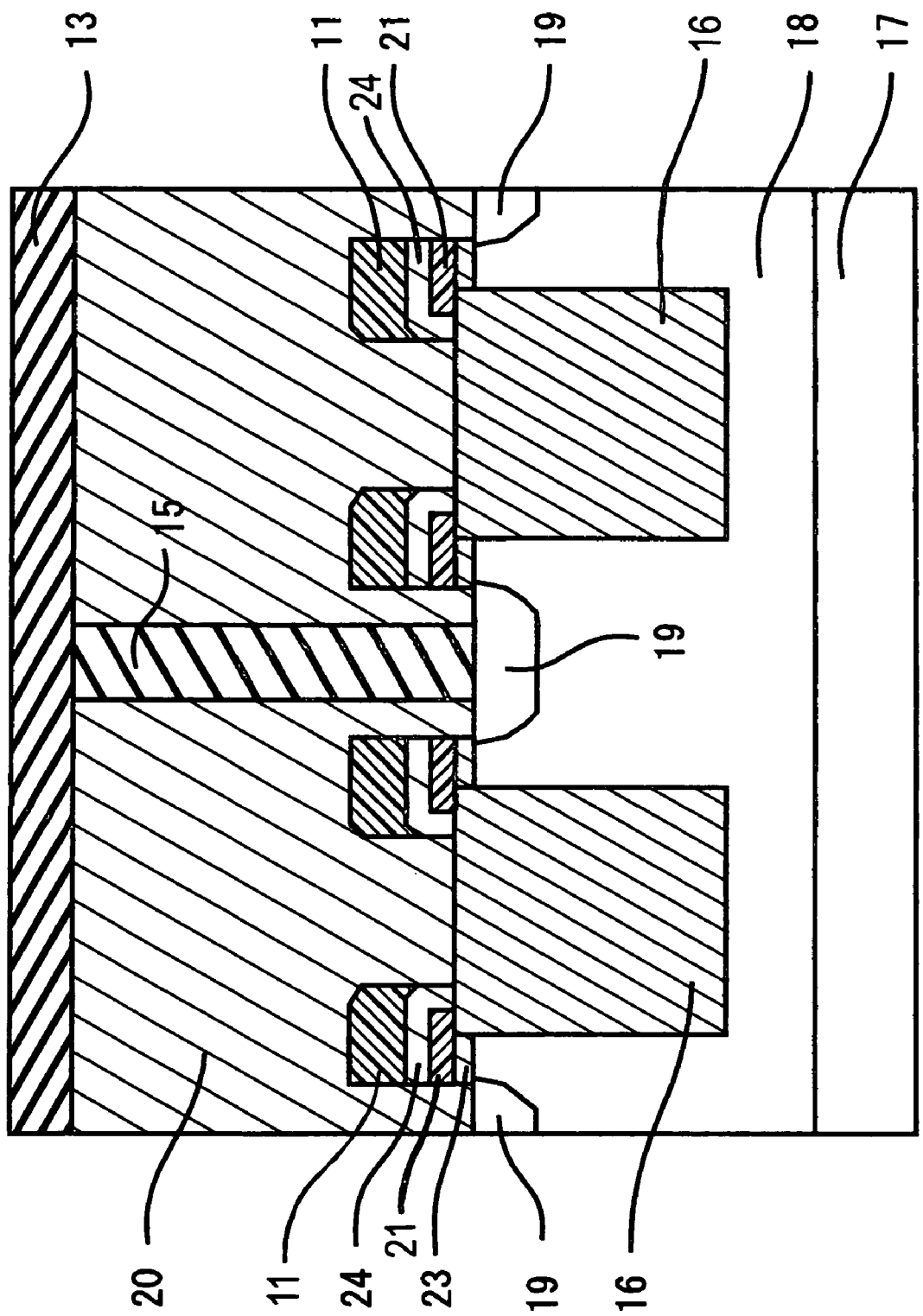
FIG. 4 is a sectional view taken in the direction of arrows C-C' of FIG. 1.
Figure 5:
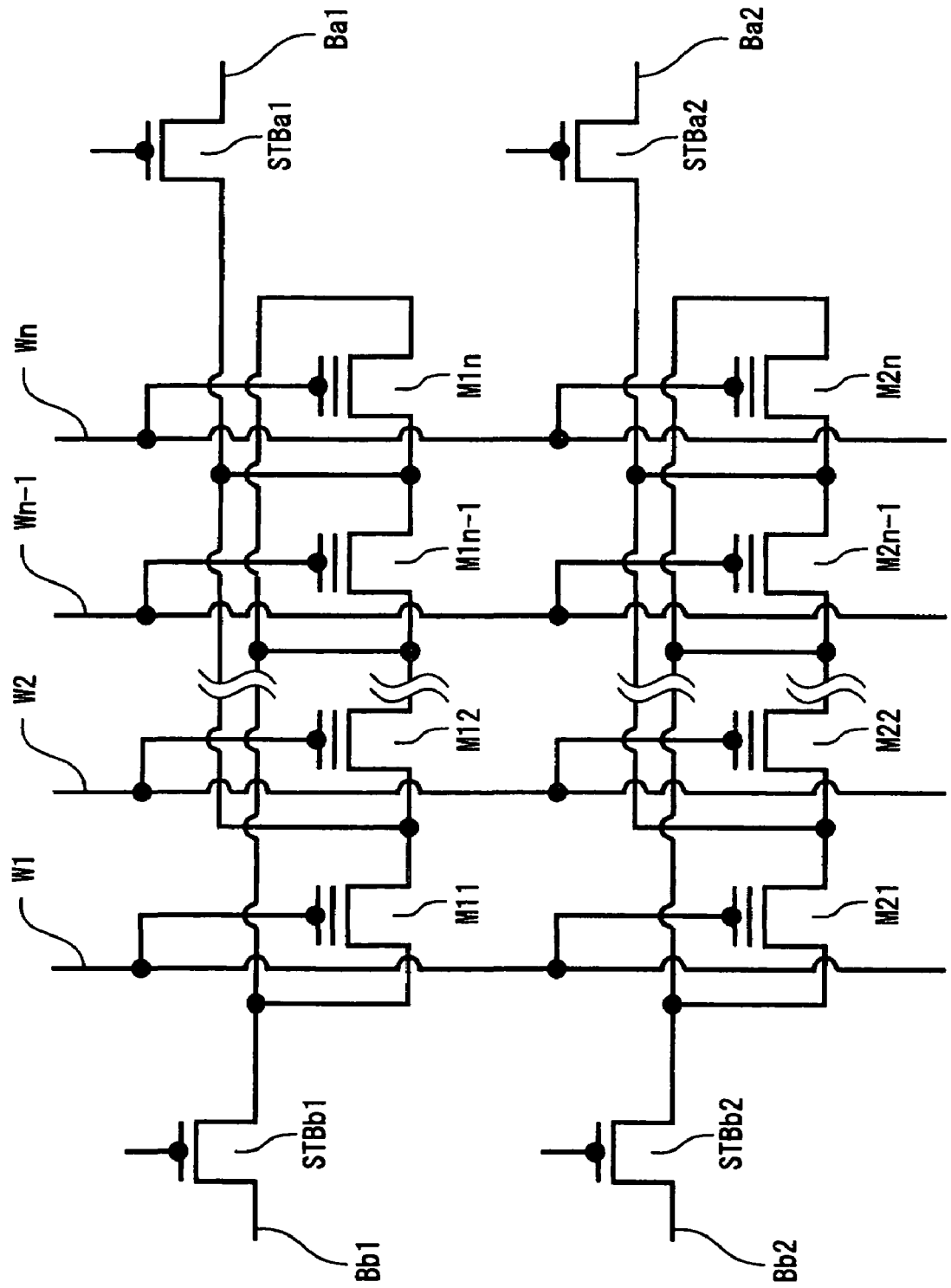
FIG. 5 is a circuit diagram of the semiconductor storage device of the first embodiment.

FIGS. 1 to 4 are schematic views of a memory cell array which is a semiconductor storage device that forms this embodiment. FIG. 1 is a schematic view thereof. FIG. 2 is a sectional view as taken along the cut-plane line A-A' of FIG. 1, FIG. 3 is a sectional view as taken along the cut-plane line B-B' of FIG. 1, and FIG. 4 is a sectional view as taken along the cut-plane line C-C' of FIG. 1. FIG. 5 is a circuit diagram of a memory cell array which is the semiconductor storage device that forms the first embodiment of the invention.

First, constitution of the semiconductor storage device of this embodiment is explained with reference to FIGS. 1 to 4. As can be seen from FIGS. 2 to 4, a P-type well region 18 is formed in a silicon substrate 17. Further, a plurality of device isolation regions 16 are formed so as to meander and extend in the lateral direction of FIG. 1 (respective meandering band regions are hatched in FIG. 1). The longitudinal pitch of the device isolation regions 16 is set to 2F (where F is the minimum machining pitch). As a result of this, silicon active regions each meandering and extending laterally are left between neighboring device isolation regions 16 in an upper portion of the P-type well region 18. The device isolation regions 16 are set to such a depth that next-described $N^+$ diffusion layers 19 are electrically isolated from each other but that the P-type well region 18 is not electrically isolated.

As can be understood by generalizing FIGS. 1 to 4, $N^+$ diffusion layers 19 are formed at turnover portions, respectively, of the meanders within the silicon active region (portions corresponding to contacts 14, 15). Each $N^+$ diffusion layer 19 serves as a source region or drain region depending on selection by bit lines during the use of this memory. In this connection, regions between neighboring $N^+$ diffusion layers 19 within identical active regions serve as channel regions, respectively.

A plurality of word lines 11 composed of polysilicon are formed so as to extend straight along a direction vertical to the direction in which the device isolation regions 16 extend (i.e., along the longitudinal direction in FIG. 1). The pitch of the word lines 11 along the lateral direction is set to 2F. A silicon active region (upper portion of the P-type well region 18) covered with a word line 11 is a channel region. The channel region and the word line 11 are isolated from each other by a multilayered film composed of a tunnel oxide film 23, a floating gate 21 and an oxide film 24. On this channel region, the word line 11 serves as a control gate.

A plurality of first bit lines 12 formed of a first-layer metal are formed so as to extend straight in a vertical direction (lateral direction in FIG. 1) with respect to the word lines 11. The first bit lines 12, whose longitudinal pitch is set to 2F, are provided so as to run on the $N^+$ diffusion layers 19 provided at one-side (crest side in FIG. 1) turnover portions of the meanders within identical silicon active regions. These first bit lines 12 and the $N^+$ diffusion layers 19 located just thereunder are disposed at a pitch of 4F in the lateral direction and connected by first bit line contacts 14. Also, a plurality of second bit lines 13 formed of a second-layer metal are formed in the same direction as the first bit lines 12 and at positions forming gaps of the first bit lines so as to extend straight parallel to the first bit lines. The second bit lines 13, whose longitudinal pitch is set to 2F, are provided so as to pass on the $N^+$ diffusion layers 19 provided at the other-side (trough side in FIG. 1) turnover portions of the meanders within identical silicon active regions. These second bit lines 13 and the $N^+$ diffusion layers 19 located just thereunder are disposed at a pitch of 4F in the lateral direction and connected by second bit line contacts 15. The first and second bit lines 12, 13 are isolated from each other by an interlayer insulator 20, and connected to the $N^+$ diffusion layers 19 by the contacts 14, 15 at necessary places as described above, respectively.

According to this constitution, one memory cell is represented by a parallelogram 22 depicted by two-dot chain line in FIG. 1, its area being $4F^2$.

The reason why the area of the memory cell of this embodiment can be reduced than in the prior art is as follows. First, not that the dopant diffusion layer in the semiconductor substrate is taken as bit lines as has been in the prior art, but that the first and second bit lines 12, 13 are formed on the silicon substrate. Therefore, the first bit lines 12 and the second bit lines 13 can be formed by using different interconnect layers isolated from each other by an interlayer insulator 20. As a result, in the planar pattern layout, there is no need for any margin that isolates the first and second bit lines 12, 13 from each other. The direct reason why such a layout has been enabled is that the shape of the active regions (regions other than the device isolation regions 16) is a wavy one having a period of 4F with respect to the lateral direction. Secondly, an $N^+$ diffusion layer 19 formed at each turnover portion of the meanders within the individual active regions serve as a source region or drain region of a field effect transistor as it is paired with another $N^+$ diffusion layer 19 neighboring thereto via the channel region within the identical active region. That is, each N$^+$ diffusion layer 19 is shared by two field effect transistors. Thus, the device area can be further reduced.

Next, circuit construction of the semiconductor storage device of this embodiment is explained with reference to FIG. 5. This memory cell array is of the so-called AND type array. That is, one first bit line and one second bit line are one paired with each other, and n (n:natural number) memory cells are connected in parallel between these bit lines. In FIG. 5, for example, a first bit line of a first bit line pair is expressed as Ba1 and a second bit line of the first bit line pair is expressed as Bb1. Also, for example, an n-th memory cell connected to the first bit line pair is expressed as M1n. A selector transistor is provided for each bit line. In FIG. 5, for example, a first-bit-line selector transistor for the first bit line pair is expressed as STBa1. Also, n word lines run vertical to the bit lines, respectively, to connect memory-cell gates to one another. In FIG. 5, the word lines are expressed as W1 to Wn.

Next, an operation example of the semiconductor storage device of this embodiment is explained with reference to FIG. 5. As an example, it is assumed that a state of low threshold of the memory cell is a write state, while a state of high threshold of the memory cell is an erase state. Further as an example, it is assumed that the drain region is connected to the first bit line while the source region is connected to the second bit line. Referring to FIG. 5, for a write operation into a memory cell M12, a negative voltage (e.g., −8 V) is applied to the word line W2, a positive voltage (e.g., 6 V) is applied to the first bit line Ba1, and further the selector transistor STBa1 is turned on. In this case, the selector transistor STBa1 is turned off (where the source region is open), and the P-type well region is set to ground voltage. By doing so, a high voltage is applied to between the control gate of the memory cell M12 and the drain region, so that electrons are pulled out from the floating gate to the drain region by FN (Fowler-Nordheim) tunneling, by which the write operation is accomplished.

On the other hand, an erase operation is performed collectively for all memory cells on a selected word line. Referring to FIG. 5, for erasing the memory cells M12 and M22, a positive voltage (e.g., 10 V) is applied to the word line W2, a negative voltage (e.g., −8 V) is applied to the second bit lines Bb1 and Bb2, and the selector transistors STBb1 and STBb2 are turned on. In this case, the selector transistors STBa1 and STBa2 are turned off (where the drain region is open), and −8 V is applied to the common P-type well region. By doing so, a high voltage is applied to between the control gates of the memory cells M12 and M22 and the P-type well region, so that electrons are injected from the P-type well region to the floating gate by FN tunneling, by which the erase operation is accomplished.

In FIG. 5, for a read operation of data of the memory cell M12, a positive voltage (e.g., 3 V) is applied to the word line W2, a positive voltage (e.g., 1 V) is applied to the first bit line Ba1, and further the selector transistor STBa1 is turned on. In this case, the second bit line Bb1 is set to ground voltage, the selector transistor STBb1 is turned on, and the source of the memory cell M12 is set to ground voltage. In addition, the P-type well region is set to ground voltage. By doing so, the data of the memory cell M12 can be read out.

It is noted that the set voltages of individual nodes for write, erase and read operations are not limited the above voltages.

Furthermore, it is also possible that the memory, which is the semiconductor storage device of this embodiment, and the logic circuit are compositely mounted on one integrated circuit. It is further possible that other memories (DRAM, SRAM, etc.) are also mounted in addition to the memory, which is the semiconductor storage device of this embodiment, and the logic circuit. In that case, larger areas can be allocated for the logic circuit or other memories in proportion to the decrease of the area occupied by the memory that is the semiconductor storage device of this embodiment, making it possible to achieve functional improvement. Otherwise, larger storage capacity can be allocated for the memory that is the semiconductor storage device of this embodiment. In that case, for example, it becomes implementable to write a large-scale program temporarily, hold the program even after the turn-off of power, and execute the program also after the reentry of power, and moreover to replace the program with another program.

Next, the procedure for fabricating the semiconductor storage device of this embodiment is explained. First, dielectric device isolation regions 16 are formed in the silicon substrate 17, and subsequently a P-type well region 18 is formed. Thereafter, tunnel oxide film 23 is formed by thermal oxidation, and a polysilicon film is formed by CVD (Chemical Vapor Deposition) process. This polysilicon film is patterned by photolithography and etching, by which a floating gate 21 is formed. After that, an oxide film and a polysilicon film are formed in this order each by CVD process. These polysilicon film, oxide film and floating gate 21 are patterned by photolithography and etching, by which word lines 11 are formed. At this stage, with the word lines 11 used as a mask, an N-type dopant is injected at low energy, by which N$^+$ diffusion layers 19 are formed in self alignment. After this, deposition of an interlayer insulator, a contact process and a metal process are iteratively performed, by which first bit lines 12 and second bit lines 13 are formed.

In the semiconductor storage device of this embodiment, the area of one cell is $4F^2$, smaller than that of the conventional AND type memory cell array. Therefore, higher integration becomes implementable, the product yield improves, and the manufacturing cost can be reduced.

Also, in the case where the memory that is the semiconductor storage device of this embodiment, a logic circuit and other memories (DRAM, SRAM, etc.) are compositely mounted, the degree of integration of the integrated circuit can be enhanced and functional improvement can be achieved.

Second Embodiment

Figure 6:
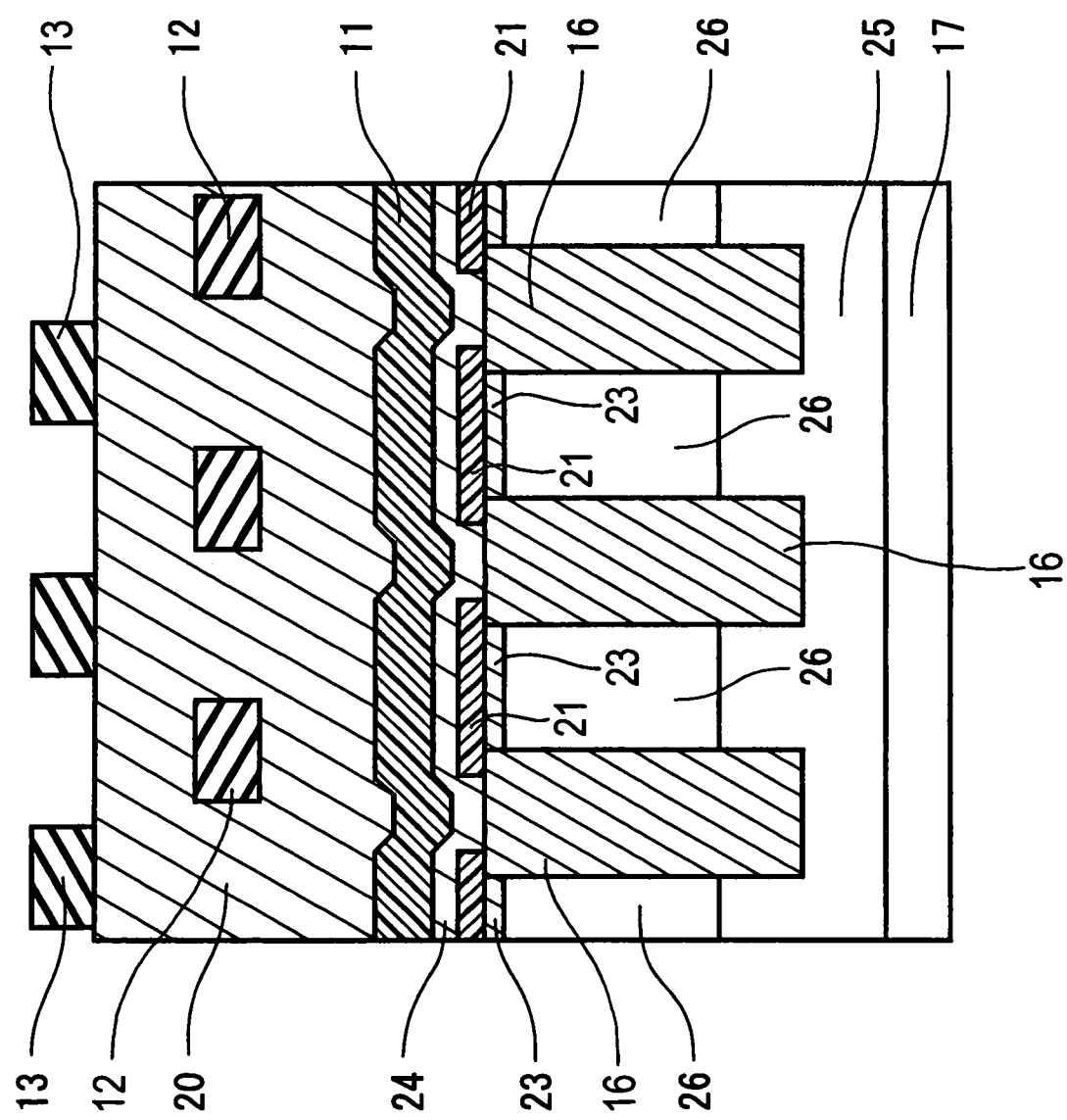
FIG. 6 is a sectional view of a semiconductor storage device of a second embodiment.
Figure 7:
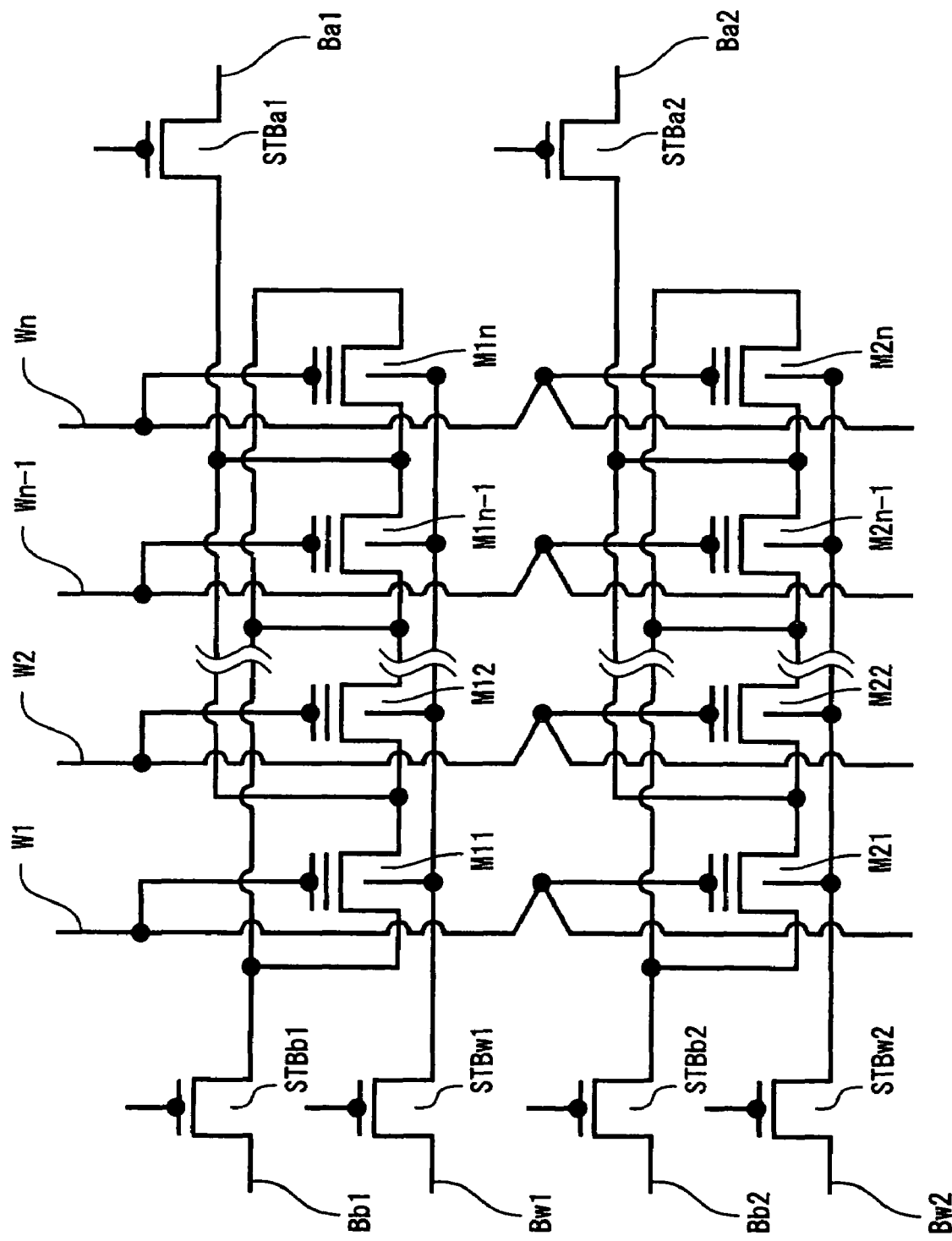
FIG. 7 is a circuit diagram of the semiconductor storage device of the second embodiment.

This embodiment is described below with reference to FIGS. 6 and 7.

The structure of the semiconductor storage device of this embodiment differs from the semiconductor storage device of the foregoing first embodiment only in the structure of the well region. FIG. 6 is a sectional view as taken along the cut-plane line B-B' of FIG. 1. An N-type deep well region 25 and a P-type shallow well region 26 are formed in a silicon substrate 17. This well region 26 is partitioned into a plurality by device isolation regions 16. The device isolation regions 16 are set to such a depth that both-side P-type shallow well regions 26 sandwiching a device isolation region 16 are electrically isolated from each other. Each of the partitioned well regions 26 extends meandering in the lateral direction in FIG. 1 as in the first embodiment. These partitioned well regions 26, as described next, serve as third bit lines, respectively.

Next, circuit construction of this embodiment is explained with reference to FIG. 7. The circuit construction of this embodiment differs from the circuit construction of the first embodiment in that the shallow well region 26 of each memory cell forms a third bit line. This third bit line connects shallow well regions of memory cells connected in parallel to a pair of bit lines composed of first bit line and second bit line. A selector transistor is connected to this third bit line. In FIG. 7, for example, a first third bit line is expressed as Bw1, and a selector transistor corresponding to that is expressed as STBw1.

In the already-described first embodiment, erase operation on a 1-bit basis is impossible. As for the reason of this, since the well region and the source/drain region cannot be put into a forward-biased state therebetween (PN forward current flows), it is impossible to apply such a bias that only one bit is selectively chosen in the case where the well region is shared by all the memory cells. However, in this embodiment, the additional provision of the third bit line makes the 1-bit basis erase implementable. Referring to FIG. 7, for an erase operation of only the memory cell M12, a positive voltage (e.g., 10 V) is applied to the word line W2, a negative voltage (e.g., −8 V) is applied to the second bit line Bb1, and the selector transistor STBb1 is turned on. In this case, the selector transistor STBa1 is turned off (where the drain region is open). In this case, further, −8 V is applied to the third bit line Bw1, and the selector transistor STBw1 is turned on. Now, the ground voltage is applied, for example, to the other third bit line and the other first bit line, so that their respective selector transistors are turned on. By doing so, a high voltage is applied only to between the control gate of the memory cell M12 and the P-type shallow well region, so that electrons are injected from the P-type shallow well region to the floating gate by FN tunneling, by which the memory cell M12 is erased singly.

An important thing in this embodiment is that the well region is partitioned into a plurality and the third bit line is provided. By the provision of the third bit line, it becomes implementable to perform the write, erase and read operations with only 1 bit selected at random.

As in the first embodiment, it is also possible that the memory, which is this embodiment, and the logic circuit are compositely mounted on one integrated circuit. It is further possible that other memories (DRAM, SRAM, etc.) are also mounted in addition to the memory, which is this embodiment, and the logic circuit. In that case, larger areas can be allocated for the logic circuit or other memories in proportion to the decrease of the area occupied by the memory that is this embodiment, making it possible to achieve functional improvement. Otherwise, larger storage capacity can be allocated for the memory that is this embodiment. In that case, for example, it becomes implementable to write a large-scale program temporarily, hold the program even after the turn-off of power, and execute the program also after the reentry of power, and moreover to replace the program with another program.

The fabrication procedure of the semiconductor storage device of this embodiment differs from the fabrication procedure of the semiconductor storage device of the first embodiment in that two steps for the formation of the N-type deep well region 25 and the formation of the P-type shallow well region 26 are required in the formation of the well region. The junction depth between the N-type deep well region 25 and the P-type shallow well region 26 is determined depending on the injection conditions (injection energy and injection amount) of dopants and subsequent thermal processes (annealing process, thermal oxidation process, etc.). These dopant injection conditions and thermal process conditions, as well as the depth of the device isolation regions 16 are set so that the P-type shallow well regions 26 are isolated from each other by the device isolation regions 16.

In this embodiment, the area of one cell is $4F^2$, smaller than that of the conventional AND type memory cell array. Therefore, higher integration becomes implementable, the product yield improves, and the manufacturing cost can be reduced.

Furthermore, in this embodiment, 1-bit basis erase is enabled, and the random access is enabled. Thus, there are no restrictions on the access method, so that the application to products is facilitated.

Also, in the case where the memory that is the semiconductor storage device of this embodiment, a logic circuit and other memories (DRAM, SRAM, etc.) are compositely mounted, the degree of integration of the integrated circuit is enhanced and functional improvement becomes achievable.

Second-a Embodiment

Figure 8:
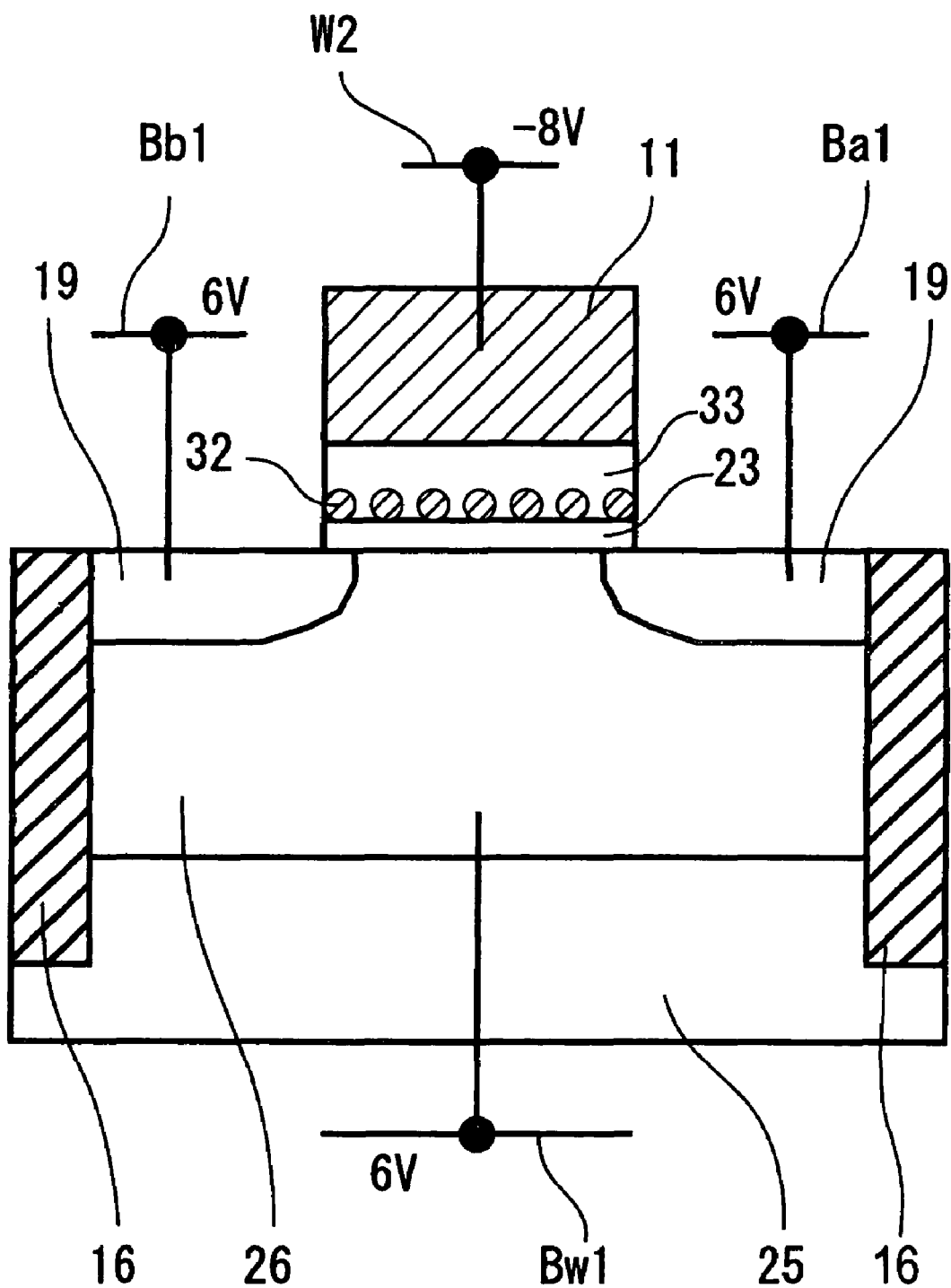
FIG. 8 is a schematic sectional view of a semiconductor storage device of a second-a embodiment.

This embodiment is described below with reference to FIG. 8. The structure of this embodiment differs from the foregoing second embodiment in that fine particles (hereinafter, referred to as "discrete dots") 32 composed of a semiconductor or conductor having a size of the nanometer (nm) order are used as a floating gate (FIG. 8). The discrete dots 32 are formed into scattered dots on a tunnel oxide film 23, and covered with a silicon oxide film 33 as a dielectric film. The discrete dots 32 may be either arrayed regularly or arranged randomly. Further, the discrete dots may also be arrayed three-dimensionally, for example, other discrete dots may be arranged just above the discrete dots via a dielectric film. On the circuit diagram, the case is entirely the same with the second embodiment (FIG. 7). It is noted here that examples of the discrete dots include silicon fine particles, metal fine particles and the like.

In a structure where the well region is in common as in the first embodiment, it is impossible to perform write operations onto memory cells using the discrete dots 32 as the floating gate. As for the reason of this, since a high voltage is applied to between the control gate and the drain region in the write operation, only electrons close to the drain region are pulled out. However, by the well region separated and used as the third bit lines, it becomes implementable to perform selective write and selective erase operations also for memory cells using the discrete dots 32 as the floating gate. This is because the third bit lines are formed of the partitioned shallow well regions 26, and independent voltages can be given thereto, respectively.

An operation example with the discrete dots 32 used as the floating gate is explained below. Referring to FIG. 7, for a write operation into the memory cell M12, a negative voltage (e.g., −8 V) is applied to the word line W2, a positive voltage (e.g., 6 V) is applied to the first bit line Ba1, the second bit line Bb1 and the third bit line Bw1, and further the selector transistors STBa1, STBb1 and STBw1 are turned on. That is, −8 V is applied to the control gate of the memory cell M12, and 6 V is applied to the source region, the drain region and the P-type shallow well regions (FIG. 8). In this case, the ground voltage is applied, for example, to the other first bit line, second bit line and third bit line, so that their respective selector transistors are turned on. By doing so, a high voltage is applied only to between the control gate of the memory cell M12 and the source region, drain region and P-type shallow well region, so that electrons are subjected to FN tunneling through the oxide film 33. That is, electrons are pulled out from the discrete dots 32 or a charge-trapping film, by which the write operation is accomplished. It is noted that for erasing the memory cell M12, it is appropriate to apply a high voltage only to between the control gate and the source region, drain region and P-type shallow well region. That is, it is appropriate to apply a positive voltage (e.g., 10 V) to the control gate and apply a negative voltage (e.g., −6 V) to the source region, drain region and P-type shallow well region. Thus, 1-bit basis erase is enabled also on memory cells using discrete dots as the floating gate or memory cells using a film that traps electric charges.

It is noted that the set voltages of individual nodes for write, erase and read operations are not limited the above voltages. In the case of a memory membrane structure using direct tunneling, the set voltages for individual nodes can be set lower than those of the above-described example.

Next, the procedure for fabricating the semiconductor storage device of this embodiment is explained. The fabrication procedure of this embodiment differs from the fabrication procedure of the second embodiment only in the formation of the floating gate. That is, after the tunnel oxide film 23 is formed, silicon fine particles are formed by LPCVD (Low Pressure Chemical Vapor Deposition) process and accumulated on the tunnel oxide film 23, by which discrete dots 32 are formed. Thereafter, an oxide film 33 is formed by CVD process. After this on, the same fabrication procedure as in the second embodiment is applied.

In the semiconductor storage device of this embodiment, there are advantages as shown below as compared with the semiconductor storage device of the second embodiment.

When discrete dots are used as the floating gate, the leakage of storage charges is reduced as compared with the flash memory. Therefore, device reliability can be improved. Also, in the case where quantum dot memory, which is one mode of memory using discrete dots, direct tunneling can be used for write and erase operations, so that device deterioration can be suppressed and its reliability can be improved.

Second-b Embodiment

Figure 9:
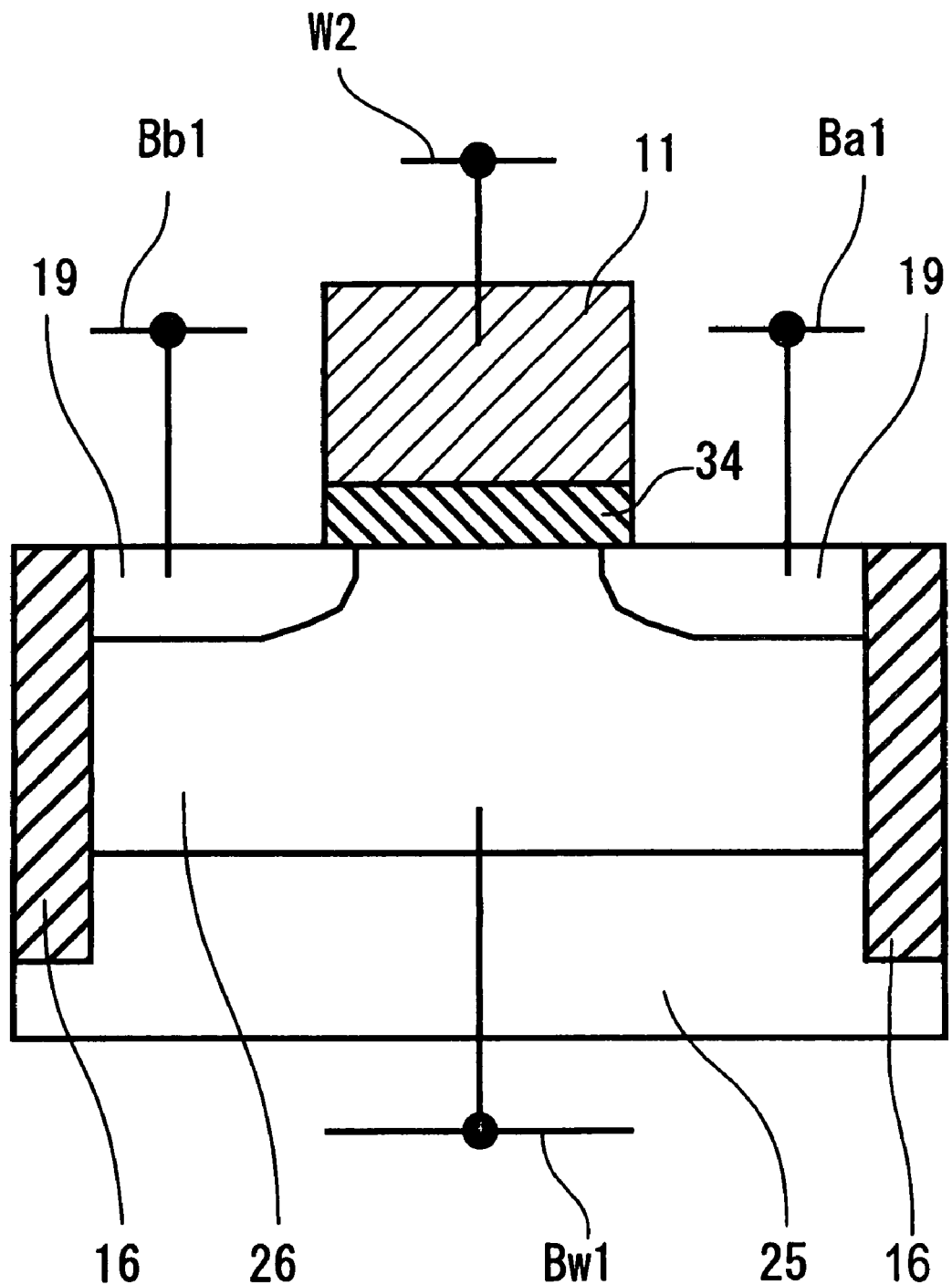
FIG. 9 is a schematic sectional view of a semiconductor storage device of a second-b embodiment.

This embodiment is explained below with reference to FIG. 9. The structure of the semiconductor storage device of this embodiment differs from the semiconductor storage device of the foregoing second embodiment in that a charge-trapping film 34 is used instead of the floating gate (FIG. 9). On the circuit diagram, the case is absolutely the same with the second embodiment (FIG. 7).

In this embodiment, it is implementable to perform selective write and selective erase operations for memory cells using the charge-trapping film instead of the floating gate, for the same reasons as described in the foregoing second-a embodiment. In this case, the charge-trapping film is, for example, $Si_3N_4/SiO_2$ film, $SiO_2/Si_3N_4/SiO_2$ film (ONO film) and devices using this are exemplified by, for example, MNOS, SNOS and SONOS. Although silicon nitride is expressed as $Si_3N_4$ and silicon oxide as $SiO_2$, yet their component ratios are not limited by these expressions. Also, ferroelectric memory film having hysteresis characteristics may also be used instead of the charge-trapping film.

An operation example in which the charge-trapping film is used instead of the floating gate may be similar to that described in the second-a embodiment. It is preferable, however, that the set voltages of individual nodes for write, erase and read operations are given by optimum values according to the charge-trapping film.

Next, the procedure for fabricating the semiconductor storage device of this embodiment is explained. The fabrication procedure of this embodiment differs from the fabrication procedure of the second embodiment only in that a charge-trapping film is formed instead of the floating gate. The charge-trapping film may be fabricated by a combinational process of thermal oxidation process and CVD film deposition process.

When discrete dots are used as the floating gate, the leakage of storage charges is reduced as compared with the flash memory. Therefore, device reliability can be improved.

Third Embodiment

This embodiment relates to a semiconductor storage device in which the semiconductor storage device of the second embodiment or the second-a embodiment or the second-b embodiment is incorporated, but in which the ratio of a voltage applied to the memory-functional film of a selected memory cell to a voltage applied to the memory-functional film of non-selected memory cells is set to the largest possible one.

Generally, in write or erase operation on memory cells, a large voltage is applied to the memory-functional film of the selected memory cell. Then, some extent of voltage would inevitably be applied also to the memory-functional film of non-selected memory cells. Therefore, for prevention of malfunction, it is preferable that the ratio of a voltage applied to the memory-functional film of a selected memory cell to a maximum value of voltages applied to the memory-functional film of non-selected memory cells is made as large as possible.

In a commonly practiced method, for example, for an erase operation, the voltage of a selected word line is set to $V_{DD}$, and the voltage of a selected bit line is set to ground voltage, and the voltage of the other word lines and bit lines is set to $V_{DD}/2$. In this case, the voltage of $V_{DD}$ is applied to the memory-functional film of selected memory cell, while the voltage of 0 or $V_{DD}/2$ is applied to the memory-functional film of non-selected memory cells. In this case, the ratio of the voltage applied to the memory-functional film of a selected memory cell to the maximum value of voltages applied to the memory-functional film of non-selected memory cells is 2.

Applied voltages to individual word lines and bit lines for write and erase operations in the semiconductor storage device of this embodiment are shown in Table 1. For a write operation, a voltage of 0 is applied to a selected word line, $(1-A) \times V_{DD}$ is applied to non-selected word lines, $V_{DD}$ is applied to a selected bit line, and $A \times V_{DD}$ is applied to non-selected bit lines. Also, for an erase operation, a voltage of $V_{DD}$ is applied to a selected word line, $A \times V_{DD}$ is applied to non-selected word lines, 0 is applied to a selected bit line, and $(1-A) \times V_{DD}$ is applied to non-selected bit lines. In this case, it holds that $1/3 \leq A < 1/2$ (where a case with A=1/2 is the above-shown commonly practiced case). The ratio of the voltage applied to the memory-functional film of a selected memory cell to the maximum value of voltages applied to the memory-functional films of non-selected memory cells becomes a maximum of 3 (in absolute value) when A=1/3. Thus, the setting of A=1/3 is most preferable.

Table 1:

Write:

|  | Bit line | |
| --- | --- | --- |
| Word line | (Selected) $V_{DD}$ | (Non-Selected) $A \times V_{DD}$ |
| (Selected) 0 | Voltage applied to film: $-V_{DD}$ | Voltage applied to film: $-A \times V_{DD}$ |
| (Non-Selected) $(1 - A) \times V_{DD}$ | Voltage applied to film: $-A \times V_{DD}$ | Voltage applied to film: $(1 - 2A) \times V_{DD}$ | where $1/3A \leq A < 1/2$

Erase:

|  | Bit line | |
|---|---|---|
| Word line | (Selected) 0 | (Non-Selected) $(1-A) \times V_{DD}$ |
| (Selected) $V_{DD}$ | Voltage applied to film: $V_{DD}$ | Voltage applied to film: $A \times V_{DD}$ |
| (Non-Selected) $A \times V_{DD}$ | Voltage applied to film: $A \times V_{DD}$ | Voltage applied to film: $(2A-1) \times V_{DD}$ | where $1/3 \leq A < 1/2$

A specific value for $V_{DD}$ may be determined optimally according to film quality or film structure. In more detail, it is preparatorily set that injection or ejection of charges occurs when the absolute value of the voltage applied to the memory-functional film is $V_{DD}$, while injection or ejection of charges does not occur when the absolute value of the voltage applied to the memory-functional film is $A \times V_{DD}$. In addition, for a read operation, the voltage applied to the memory-functional film is preferably set to not more than $A \times V_{DD}$, in which case there never occurs destruction of storage due to the read operation.

In this embodiment, the ratio of the voltage applied to the memory-functional film of selected memory cell to the maximum value of voltages applied to the memory-functional film of non-selected memory cells is a large one, so that a memory having large operational margin can be implemented.

Fourth Embodiment

Figure 10:
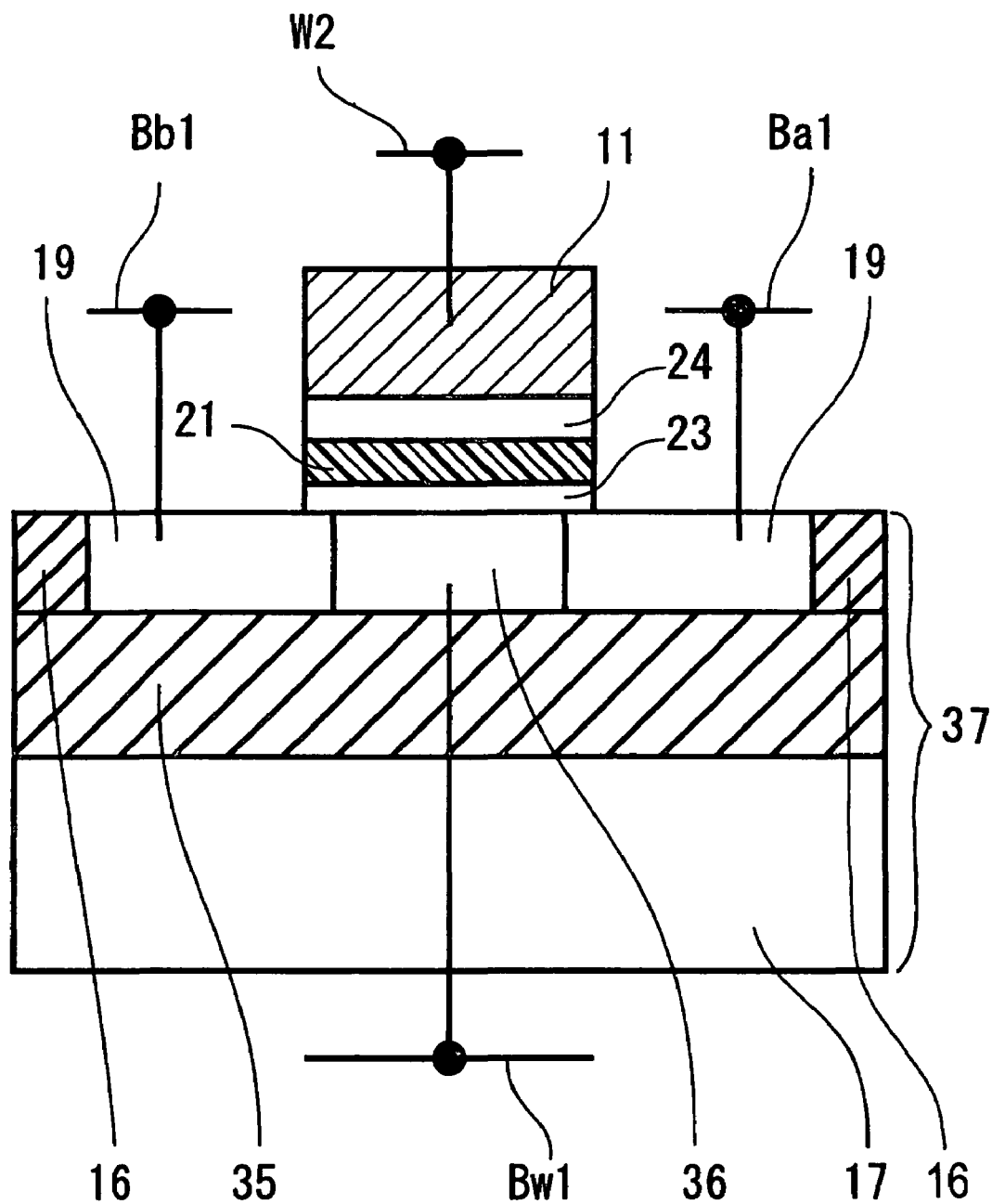
FIG. 10 is a schematic sectional view of a semiconductor storage device of a fourth embodiment.

This embodiment is described below with reference to FIG. 10.

The semiconductor storage device of this embodiment differs from the semiconductor storage devices of the first, second, second-a, second-b and third embodiments in that an SOI (Silicon on Insulator) substrate is used instead of the silicon substrate 17 of the semiconductor storage device of any one of those foregoing embodiments. This SOI substrate 37 has a body 36 made of silicon and provided on the silicon substrate 17 via a buried oxide film 35. A plan view of the semiconductor storage device of this embodiment is the same as FIG. 1. FIG. 10 is a schematic view of a cross section of a memory cell in the semiconductor storage device of this embodiment (shown is a case in which a sheet-like floating gate is used). When the body 36 on the buried oxide film 35 is provided as a common body, the resulting operation is similar to that of the first embodiment. On the other hand, when independent voltages are respectively given to a plurality of bodies 36 partitioned by the device isolation regions 16 for use as third bit lines, it becomes possible to execute random access as in the second, second-a, second-b and third embodiments. The floating gate 21 may be given by discrete dots or a charge-trapping film or by a ferroelectric film having hysteresis. Although FIG. 10 shows a case of the completely depletion type, yet a partially depletion type may also be adopted. In that case, the resistance of the body that becomes the third bit line can be reduced, allowing higher speed of the device to be implemented.

Next, the procedure for fabricating the semiconductor storage device of this embodiment is explained. First, device isolation regions 16 are formed in the SOI substrate 37. Subsequently, dopant injection into the body 35 is performed so that the memory device has a proper threshold. The formation of upper structure after this is the same as in the procedure of formation of the first, second, second-a and second-b embodiments.

In this embodiment, the following effects can be obtained in addition to the effects obtained by the first, second, second-a, second-b and third embodiments. In this embodiment, for the presence of the thick buried oxide film 35, the electrostatic capacity between the body 36 and the silicon substrate 17 can be made very small. In contrast, in the second, second-a, second-b and third embodiments, the electrostatic capacity between the shallow well region 26 and the deep well region 25 is quite large. Also, with the use of the SOI substrate 37, the junction capacity between the N$^+$ active layers 19 and the body 36 can be made quite small. As a result of this, in this embodiment, the consumption current for charging the capacity can be made small. Furthermore, with the use of the SOI substrate 37, the depth of the N$^+$ active layers 19 can be easily made shallower, so that the short-channel effect can be suppressed and a micro-finer device can be implemented. From the above reasons, the use of the SOI substrate makes it feasible to achieve power consumption reduction and micro-fining.

Fifth Embodiment

Figure 11:
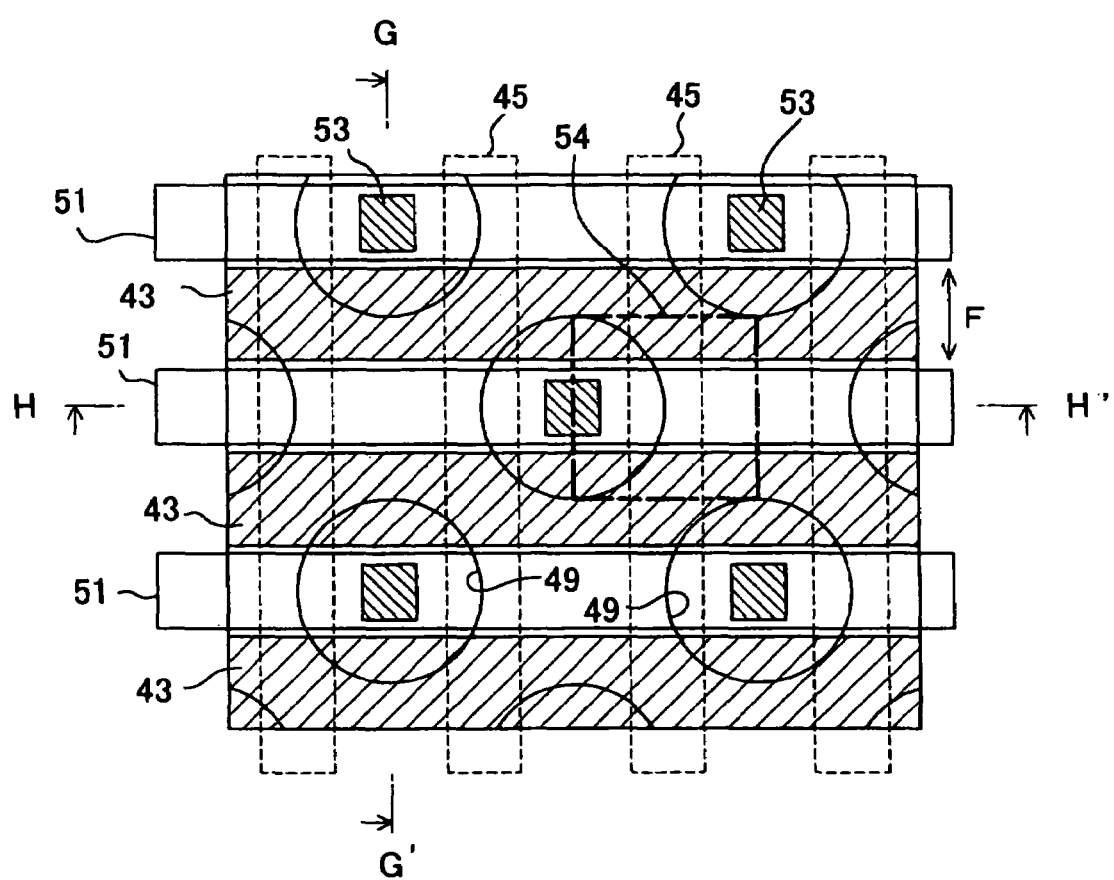
FIG. 11 is a schematic view showing a planar pattern of a semiconductor storage device of a fifth embodiment.
Figure 12:
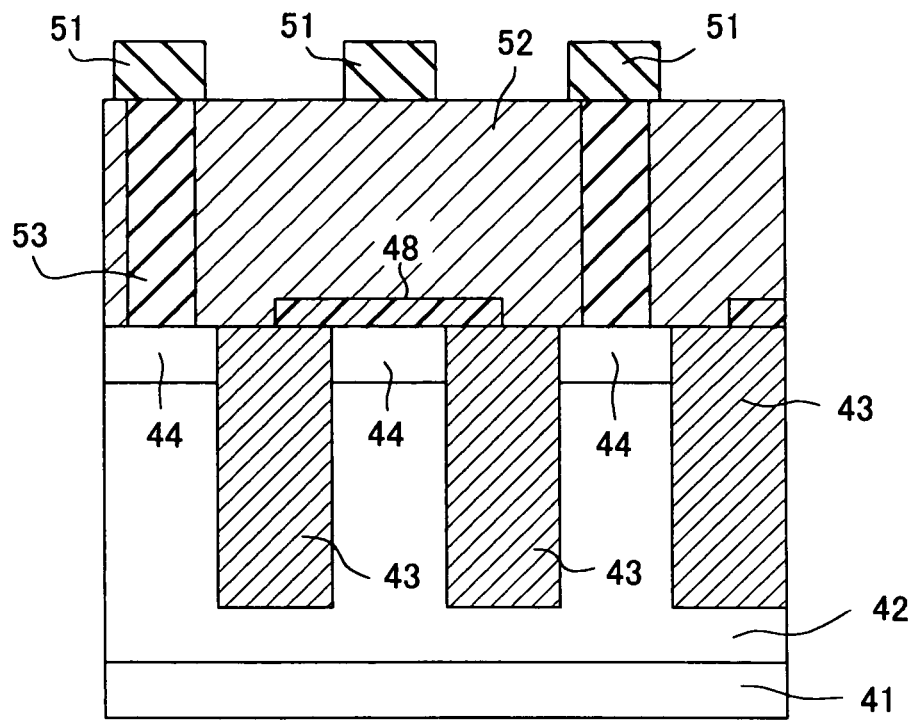
FIG. 12 is a sectional view taken in the direction of arrows G-G' of FIG. 11.
Figure 13:
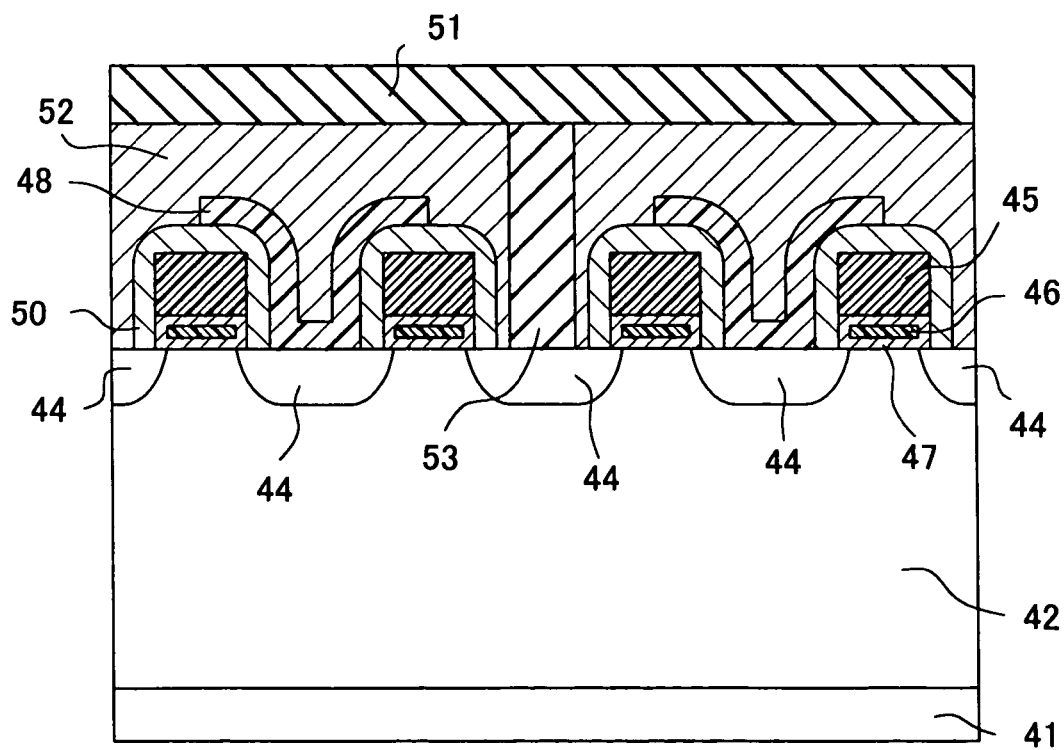
FIG. 13 is a sectional view taken in the direction of arrows H-H' of FIG. 11.
Figure 14:
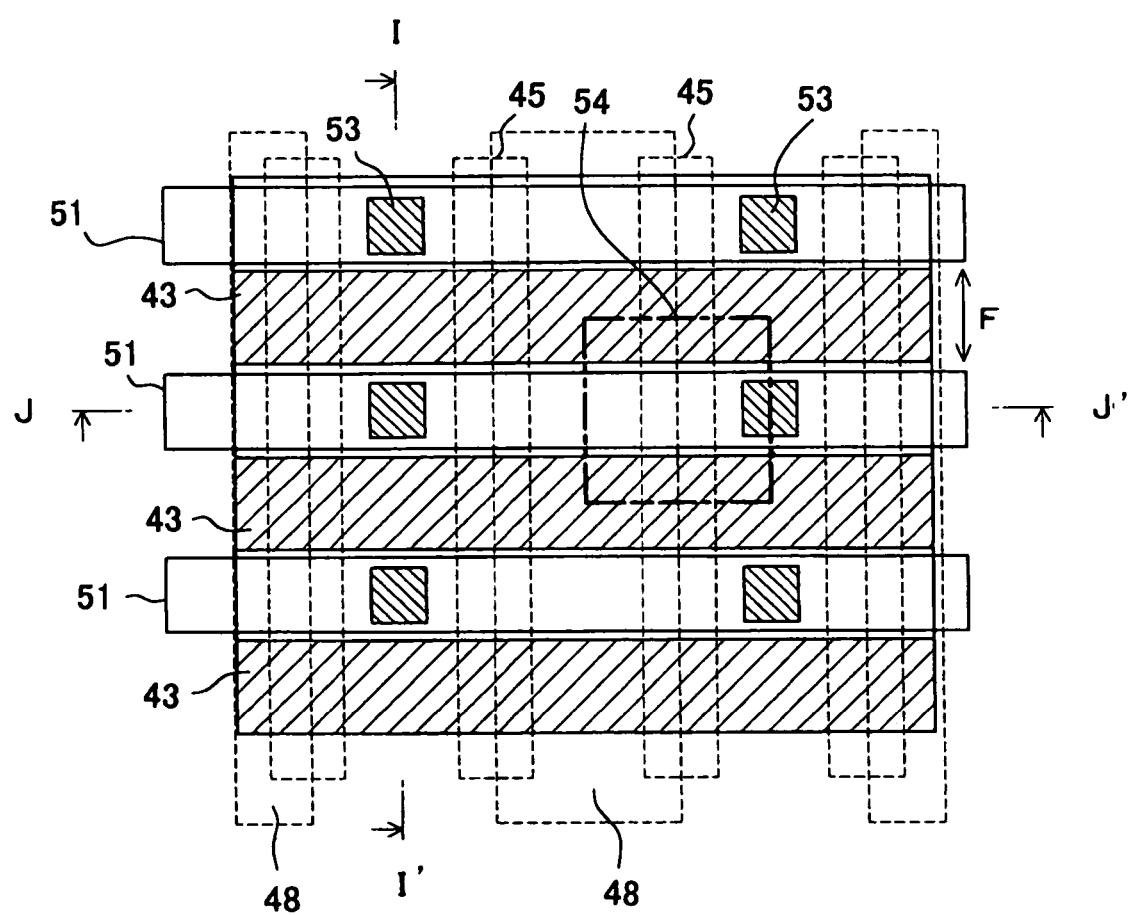
FIG. 14 is a schematic view showing a planar pattern of a modification of the fifth embodiment.
Figure 15:
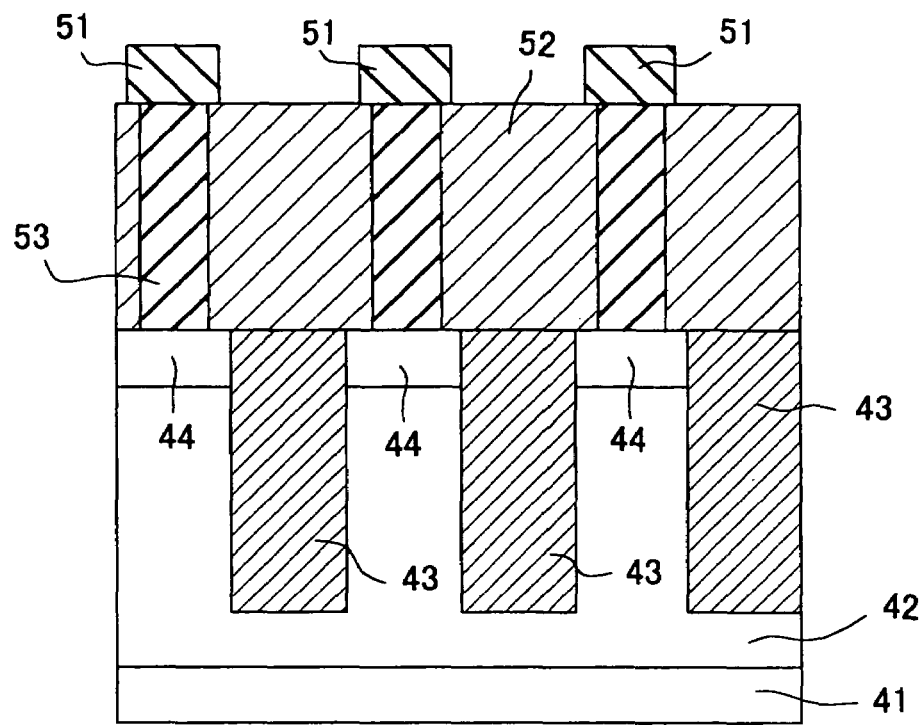
FIG. 15 is a sectional view taken in the direction of arrows I-I' of FIG. 14.
Figure 16:
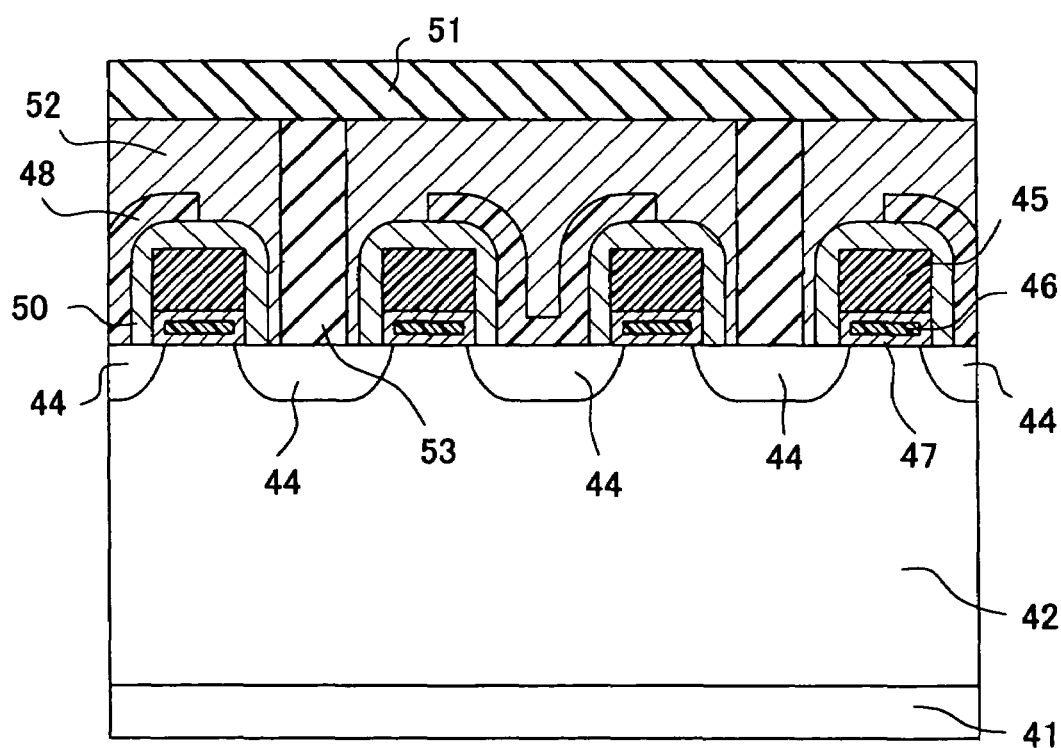
FIG. 16 is a sectional view taken in the direction of arrows J-J' of FIG. 14.
Figure 17:
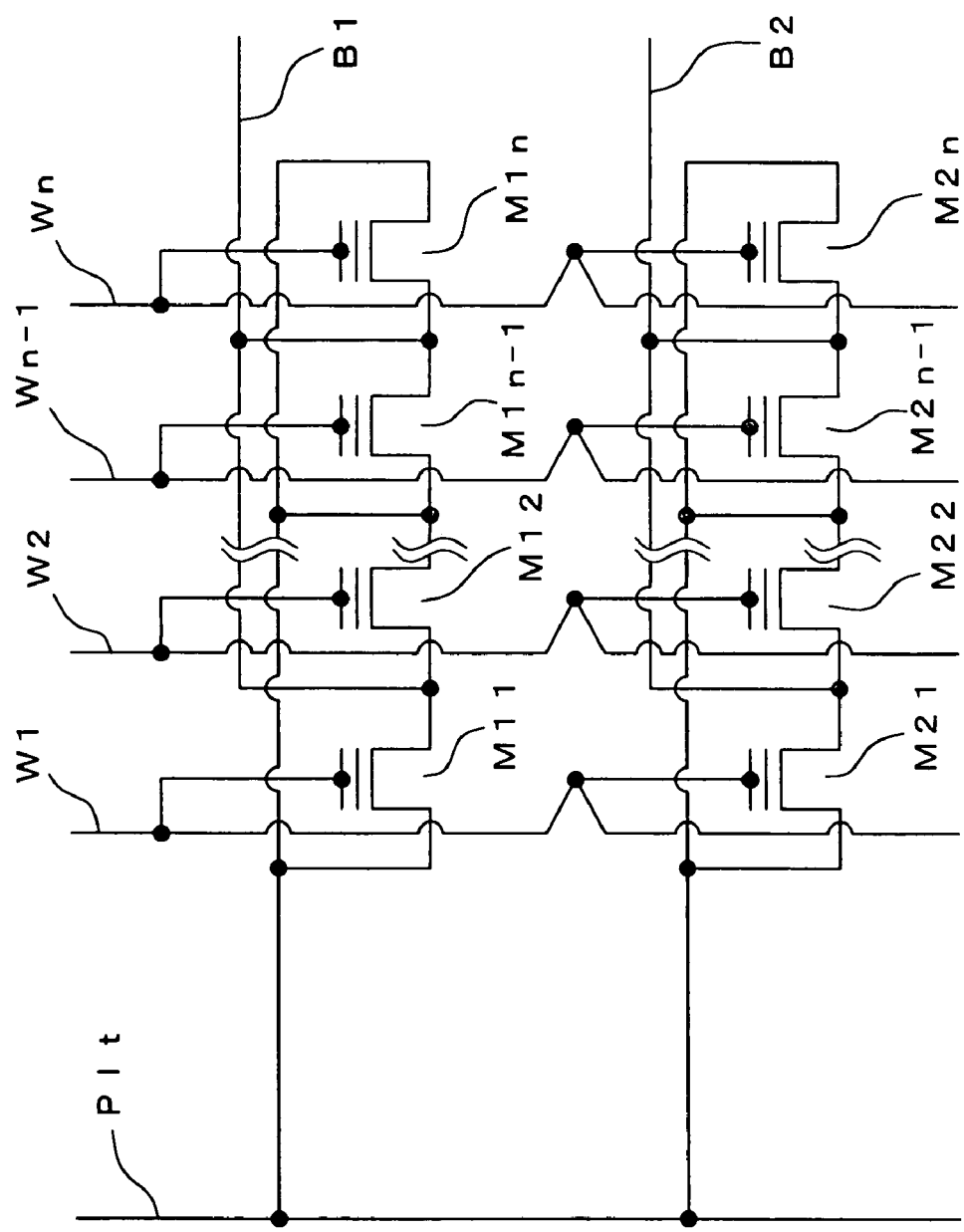
FIG. 17 is a circuit diagram of the semiconductor storage device of the fifth embodiment.

The semiconductor storage device of this embodiment is described with reference to FIGS. 11 to 17. FIG. 11 is a schematic view showing a planar pattern of the memory cell array in the semiconductor storage device of this embodiment. FIG. 12 is a sectional view as taken along a line G-G' of FIG. 11, and FIG. 13 is a sectional view as taken along a line H-H' of FIG. 11. Further, FIGS. 14 to 16 show a modification of the memory cell array shown in FIGS. 11 to 13. FIG. 14 is a schematic view showing a planar pattern, FIG. 15 is a sectional view as taken along a line I-I' of FIG. 14, and FIG. 16 is a sectional view as taken along a line J-J' of FIG. 14. FIG. 17 is a circuit diagram of the semiconductor storage device shown in FIGS. 11 to 16.

First, constitution of the semiconductor storage device of this embodiment is explained with reference to FIGS. 11 to 13. As shown in FIGS. 12 and 13, a P-type well region 42 is formed in a silicon substrate 41. Further, a plurality of device isolation regions 43 are formed and arrayed at a pitch of 2F (where F is a minimum machining pitch) so as to extend linearly in one direction (lateral direction in FIG. 11) as shown by hatching in FIG. 11. As a result of this, as shown in FIG. 12, silicon active regions are formed so as to extend laterally in upper part of the P-type well region 42 and to be sandwiched by neighboring device isolation regions 43. The device isolation regions 43 are set to such a depth that next-described N$^+$ diffusion layers 44 are electrically isolated from each other but that the P-type well region 42 is not electrically isolated.

In upper part of the P-type well region 42 are formed N$^+$ diffusion layers 44 as a dopant diffusion region. Each of the N$^+$ diffusion layers 44 functions as a source region or drain region according to the selection by bit lines during the use of this memory. A plurality of word lines 45 composed of an electrical conductor such as dopant-introduced polysilicon, polycide or metal are formed so as to extend straight in the vertical direction (longitudinal direction in FIG. 11) against the direction of the device isolation regions 43. The silicon active regions located under the word lines 45 (upper portion of the well region 42) are channel regions. These channel regions and the word lines 45 are isolated from each other by a multilayered film composed of a floating gate 46 and silicon oxide film 47. On this channel region, the word line 45 serves as a control gate.

Plate electrodes 48 composed of dopant-introduced polysilicon, polycide, metal or the like cover the top of the $N^+$ diffusion layers 44, the top of the device isolation regions 43 and the top of the word lines 45 other than plate electrode holes 49 (see FIG. 11). Then, the plate electrodes 48 are electrically connected to one of the source region and the drain region in the $N^+$ diffusion layers 44. Also, the plate electrodes 48 and the word lines 45 are electrically isolated from each other by a dielectric film 50. A plurality of bit lines 51 formed of metal are disposed at a pitch of 2F so as to extend straight in a vertical direction (lateral direction in FIG. 11) with respect to the word lines 45. A device formation region (top of the well region 42) and an interconnect layer in which the bit lines 51 are formed are isolated from each other by an interlayer insulator 52, while the bit lines 51 and the other one of the source region and the drain region are connected to each other at a pitch of 4F by bit line contacts 53 provided at the positions of the plate electrode holes 49. It is noted that one memory cell is represented by a rectangle 54 depicted by two-dot chain line in FIG. 11, its area being $4F^2$.

The memory cell array may also be formed into shapes shown in FIGS. 14 to 16 (in which the same reference numerals as numerals for component parts in FIGS. 11 to 13 are used). In the case of the memory cell array shown in FIGS. 14 to 16, a plate electrode 48 is strip-shaped and the strip-shaped plate electrodes 48 are arrayed in parallel at a pitch of 4F in the same direction as the word lines 45. Then, the bit line contacts 53, which are connected to the other one of the source region and the drain region in regions at which the plate electrodes 48 are absent (between the plate electrodes 48), are arrayed linearly at a pitch of 2F in a direction along which the word lines 45 extend.

Next, circuit construction of the semiconductor storage device of this embodiment is explained with reference to FIG. 17. The memory cell array constituting this semiconductor storage device is of the so-called AND type array. That is, n (n:natural number) memory cells M are connected in parallel to one bit line B. In FIG. 17, for example, a first bit line is expressed as B1, and an n-th memory cell connected to the first bit line B1 is expressed as M1n. Also, n word lines W are arrayed vertically to the bit lines B, respectively, so as to connect control gates 15 of the respective memory cells M to each other. In FIG. 17, the word lines are expressed as W1 to Wn. It is noted that one of the source region and the drain region is connected to one another by a plate electrode (expressed as Plt).

Next, an operation example of the semiconductor storage device of this embodiment is explained with reference to FIG. 17. As an example, it is assumed that a state of low threshold of each memory cell is a write state, while a state of high threshold is an erase state. Further as an example, it is assumed that the drain region is connected to the bit line B while the source region is connected to the plate electrode Plt. Furthermore, the plate electrode Plt is large in electrostatic capacity with the other nodes, and so its voltage is desirably maintained constant. The following description is made on a case where the voltage of the plate electrode Plt is set at 0 V at all times, but the present invention is not limited to this.

Referring to FIG. 17, for a write operation into a memory cell M12, a negative voltage (e.g., −8 V) is applied to the word line W2, and a positive voltage (e.g., 6 V) is applied to the first bit line B1. In this case, the voltage of the plate electrode Plt and the P-type well region 42 is set to ground voltage (0 V). By doing so, a high voltage is applied to between the control gate 45 of the memory cell M12 and drain region, so that electrons are pulled out from the floating gate 46 to the drain region by FN (Fowler-Nordheim) tunneling, by which the write operation is accomplished.

On the other hand, an erase operation is performed collectively for all memory cells M on a selected word line. Referring to FIG. 17, for erasing the memory cell M12 and the memory cell M22, a positive voltage (e.g., 18 V) is applied to the word line W2, and the voltage of the plate electrode Plt and the P-type well region 42 is set to ground voltage (0 V). In this case, the drain region is set open. By doing so, a high voltage is applied to between the control gates 45 of the memory cell M12 and the memory cell M22 and the P-type well region 42, so that electrons are injected from the P-type well region 42 to the floating gate 46 by FN tunneling, by which the erase operation is accomplished.

In FIG. 17, for a read operation of data of the memory cell M12, a positive voltage (e.g., 3 V) is applied to the word line W2, a positive voltage (e.g., 1 V) is applied to the first bit line B1. In this case, the voltage of the plate electrode Plt and the P-type well region 42 is set to ground voltage (0 V). By doing so, the data of the memory cell M12 can be read out.

It is noted that the set voltages of individual nodes for write, erase and read operations are not limited the above voltages.

Furthermore, it is also possible that the memory, which is the semiconductor storage device of this embodiment, and the logic circuit are compositely mounted on one integrated circuit. Otherwise, it is further possible that other memories (DRAM, SRAM, etc.) are also mounted compositely in addition to the memory, which is the semiconductor storage device of this embodiment, and the logic circuit. In that case, larger areas can be ensured for the logic circuit or other memories in proportion to the extent to which the area occupied by the memory that is the semiconductor storage device of this embodiment can be decreased as described above, making it possible to achieve functional improvement. Otherwise, in proportion to the extend to which the area occupied by the memory that is the semiconductor storage device of this embodiment can be decreased, larger storage capacity can be allocated for the memory as the occupation area remains the same as conventional. In that case, for example, it becomes implementable to write a large-scale program temporarily, hold the program even after the turn-off of power, and execute the program also after the reentry of power, and moreover to replace the program with another program.

Next, the procedure for fabricating the semiconductor storage device of this embodiment is explained. First, dielectric device isolation regions 43 are formed in the silicon substrate 41, and subsequently a P-type well region 42 is formed. Thereafter, tunnel oxide film is formed by thermal oxidation, and a polysilicon film 46 is formed by CVD (Chemical Vapor Deposition) process. This polysilicon film 46 is patterned by photolithography and etching, by which a floating gate 46 is formed. After that, a silicon oxide film and a polysilicon film 45 are formed in order by CVD process. Further, a dielectric film 50 of silicon oxide or silicon nitride or the like is formed on the polysilicon film 45 by CVD process.

After that, the dielectric film 50, the polysilicon film 45 and the silicon oxide film are patterned by photolithography and etching, by which word lines 45 are formed. In that case, it is also possible that only the dielectric film 50 is patterned with the photoresist used as a mask, and the polysilicon film 45 and the silicon oxide film are patterned by etching under the condition that the dielectric film 50 patterned after the removal of photoresist is used as a mask. After the word lines 45 are formed in this way, silicon nitride is deposited all over by the CVD process and further etched back, by which side walls of the word lines 45 are covered with the dielectric film 50.

After that, an N-type dopant is injected at low energy with the word lines 45 used as a mask, by which $N^+$ diffusion layers 44 are formed in self alignment on the surface of the P-type well region 42. After this, a polysilicon film 48 is deposited all over and patterned, by which plate electrodes 48 are formed. Then, deposition of an interlayer insulator 52, a contact process and a metal process are performed, by which bit lines 51 are formed.

Figure 32:
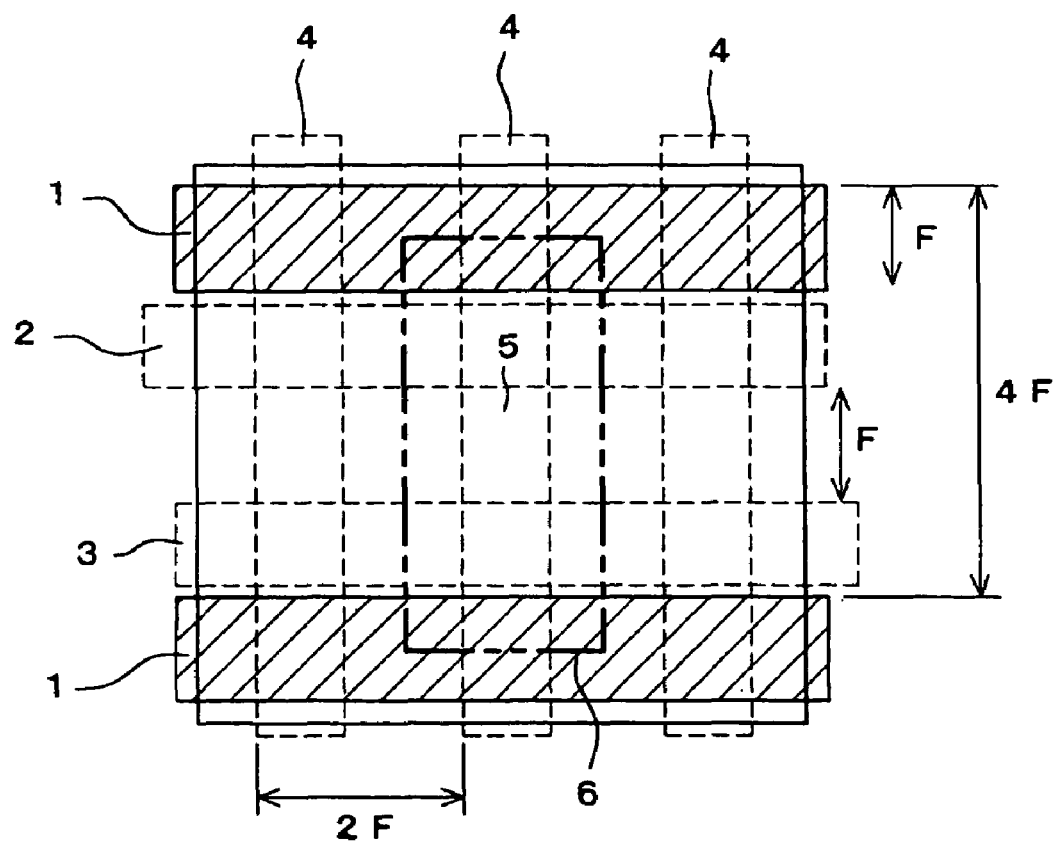
FIG. 32 is a view showing a planar pattern in a conventional AND type memory cell array.

As described above, in this embodiment, the bit lines 51 and the plate electrodes 48, which are alternately connected to the $N^+$ diffusion layers 44, are formed upward of the P-type well region 42 of the silicon substrate 41. Therefore, the bit lines 51 and the plate electrodes 48 can be formed in a stacking form by using different interconnect layers isolated by the interlayer insulator 52. As a result, in a planar pattern layout, there is no need for the margin equivalent to a distance of 1F to which the source line 2 and the bit line 3 formed of an identical dopant diffusion layer in the semiconductor substrate are isolated from each other as has been in the conventional semiconductor storage device shown in FIG. 32. Further, within the silicon active regions sandwiched by the device isolation regions 43 and extending linearly, the $N^+$ diffusion layers 44 formed on both sides of each word line 45 perpendicular to the device isolation regions 43 (i.e., the $N^+$ diffusion layers 44 neighboring each other via each channel region) serve as a source region and a drain region of an FET as they are paired respectively. That is, each of the $N^+$ diffusion layers 44 is shared by two FETs. Thus, $N^+$ diffusion layers 44 corresponding to a width of 1F in conventional one memory cell shown in FIG. 32 become unnecessary. As a consequence of the above, the longer side of a 4F×2F (=8F$^2$) memory cell depicted by two-dot chain line in FIG. 32 is shortened by an extent of 2F as described below. Thus, the size of the memory cell becomes 2F×2F as shown by two-dot chain line in FIG. 11 and FIG. 14, and its area can be made 4F$^2$, smaller than 6F$^2$ of the NAND type memory.

Conclusionly, according to the semiconductor storage device of this embodiment, erase operation on the word line basis is enabled as in the conventional AND type memory cell array, its read speed is also comparable thereto, and moreover the area of one memory cell can be made smaller than that of the conventional AND type memory cell array. Therefore, higher integration becomes implementable, the product yield improves, and the manufacturing cost can be reduced.

Also, in the case where the memory that is the semiconductor storage device of this embodiment, a logic circuit and other memories (DRAM, SRAM, etc.) are compositely mounted to make up an integrated circuit, the degree of integration of the integrated circuit can be enhanced and functional improvement can be achieved.

Sixth Embodiment

Figure 18:
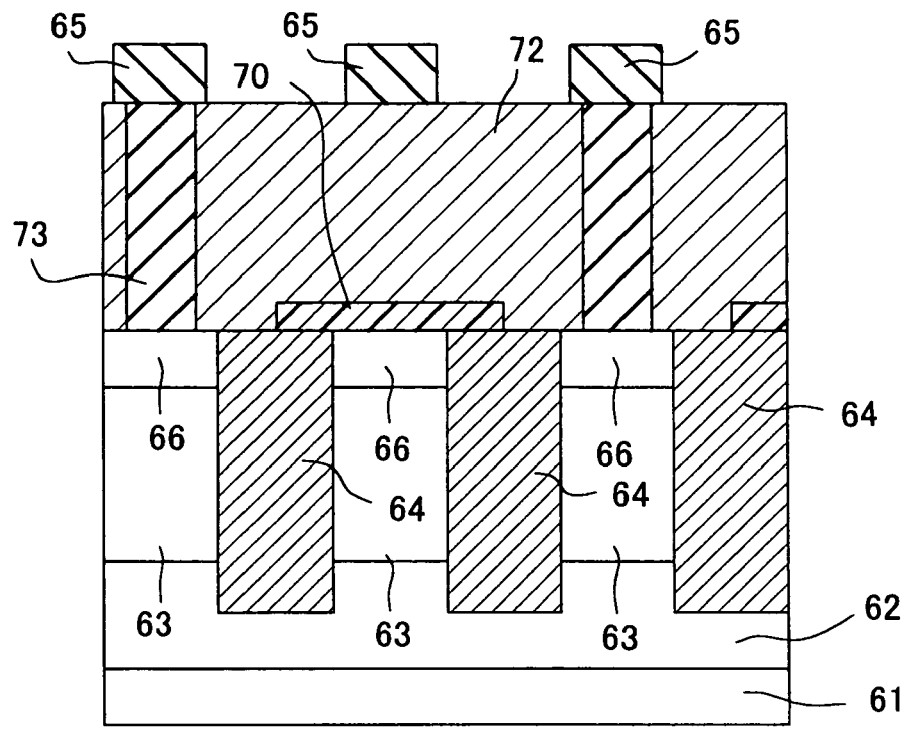
FIG. 18 is a sectional view of a semiconductor storage device of a sixth embodiment.
Figure 19:
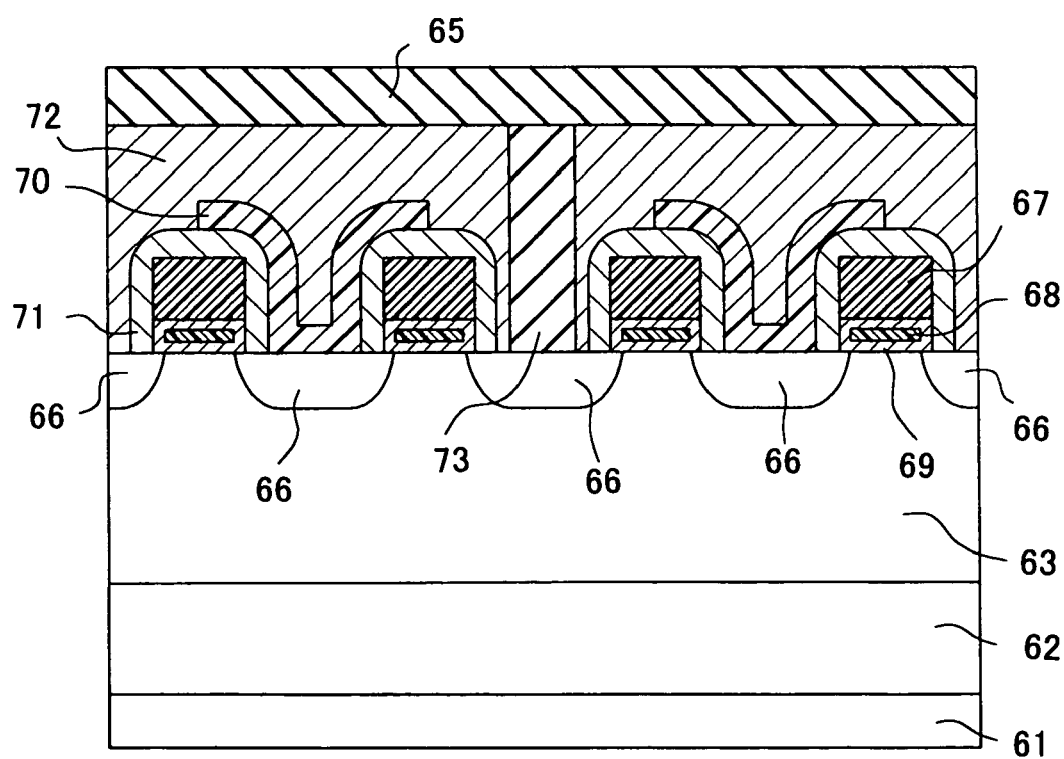
FIG. 19 is a sectional view along a direction different from that of FIG. 18.

This embodiment is explained with reference to FIGS. 18 to 22. The semiconductor storage device of this embodiment differs from that of the foregoing fifth embodiment in the structure of well region. FIGS. 18 and 19 are sectional views of a memory cell array in the semiconductor storage device of this embodiment, corresponding to FIGS. 12 and 13 in the fifth embodiment. Further, FIGS. 20 and 21 are also sectional views of a memory cell array in the semiconductor storage device of this embodiment, corresponding to FIGS. 15 and 16 in the fifth embodiment.

Referring to FIGS. 18 and 19, an N-type deep well region 62 and P-type shallow well regions 63 are formed in a silicon substrate 61. Device isolation regions 64 are set to such a depth that both-side P-type shallow well regions 63 sandwiching a device isolation region 64 are electrically isolated from each other. That is, an array of elongate P-type shallow well regions 63 is formed at a pitch of 2F, and these are electrically isolated from each other by the device isolation regions 64. These P-type shallow well regions 63, which are arrayed along the same direction as first bit lines 65 corresponding to the bit lines 51 of the fifth embodiment, can be made to serve as second bit lines.

It is noted that $N^+$ diffusion layers 66, word lines 67, floating gate 68, silicon oxide film 69, plate electrodes 70, dielectric film 71, interlayer insulator 72 and bit line contacts 73 in FIGS. 18 and 19 are identical to the $N^+$ diffusion layers 44, the word lines 45, the floating gate 46, the silicon oxide film 47, the plate electrodes 48, the dielectric film 50, the interlayer insulator 52 and the bit line contacts 53, respectively, in FIGS. 12 and 13 of the fifth embodiment.

Figure 20:
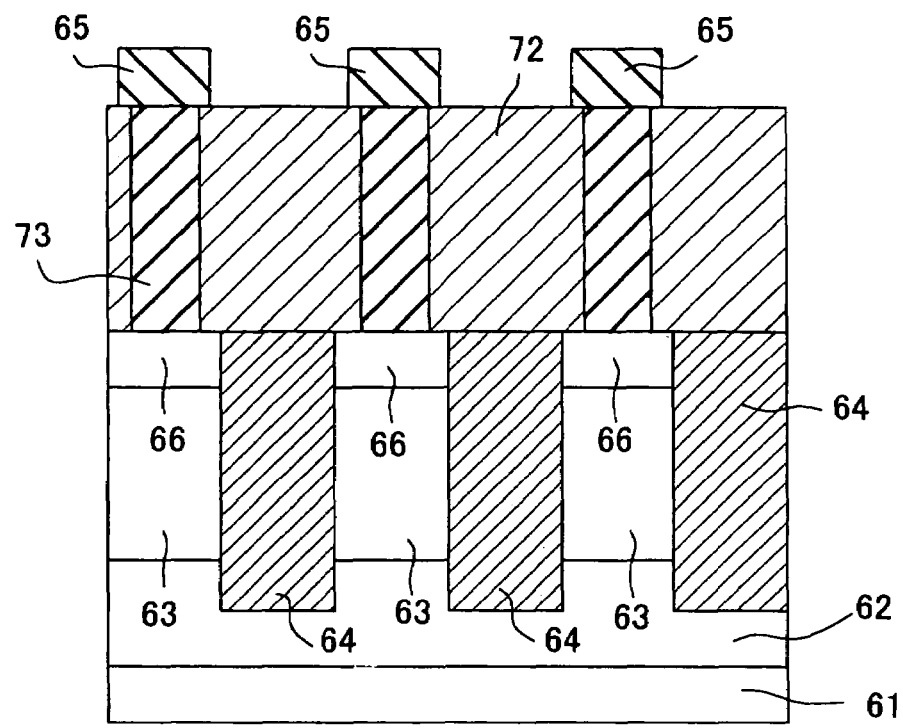
FIG. 20 is a sectional view of a modification of the sixth embodiment.
Figure 21:
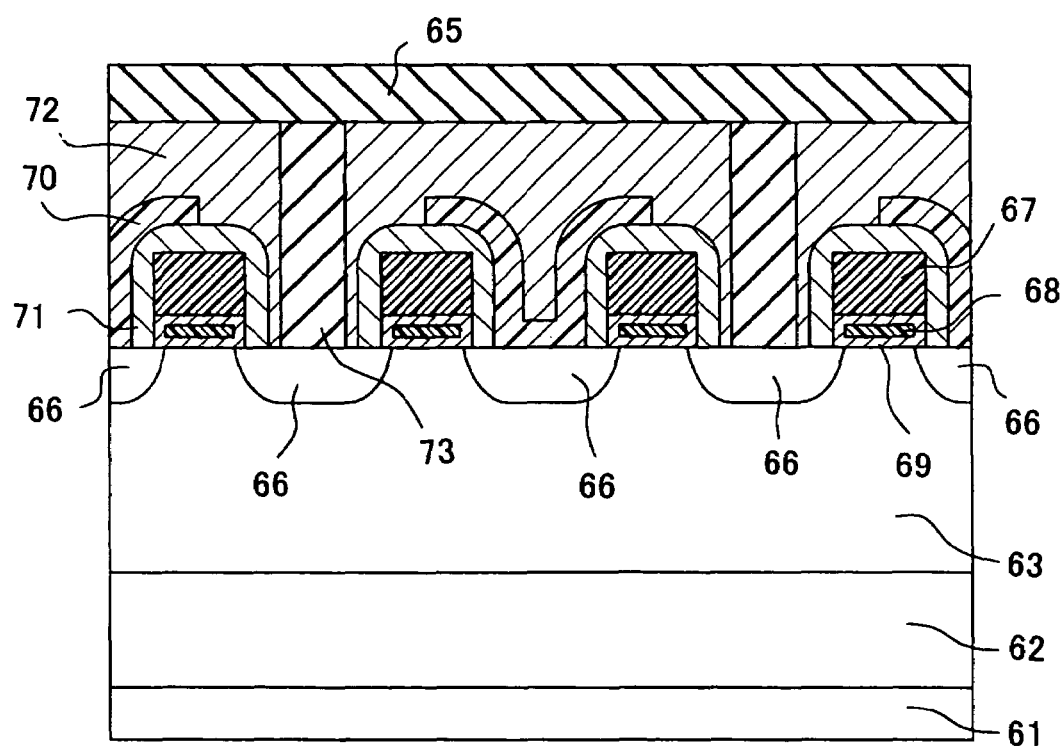
FIG. 21 is a sectional view along a direction different from that of FIG. 20.

In the memory cell array shown in FIGS. 20 and 21, as in the case of the memory cell array shown in FIGS. 14 to 16 of the fifth embodiment, the plate electrodes 70 are strip-shaped (see FIG. 14), and these strip-shaped plate electrodes 70 are arrayed in parallel at a pitch of 4F along the same direction as the word lines 67. Then, the bit line contacts 73, which are connected to one of the source region and the drain region in regions at which the plate electrodes 70 are absent (between the plate electrodes 70), are arrayed linearly at a pitch of 2F in a direction along which the word lines 67 extend. The rest of the memory cell array being similar to the memory cell array shown in FIGS. 18 and 19, an N-type deep well region 62 and a P-type shallow well regions 63 are formed in the silicon substrate 61, and the P-type shallow well regions 63 constitute second bit lines.

Figure 22:
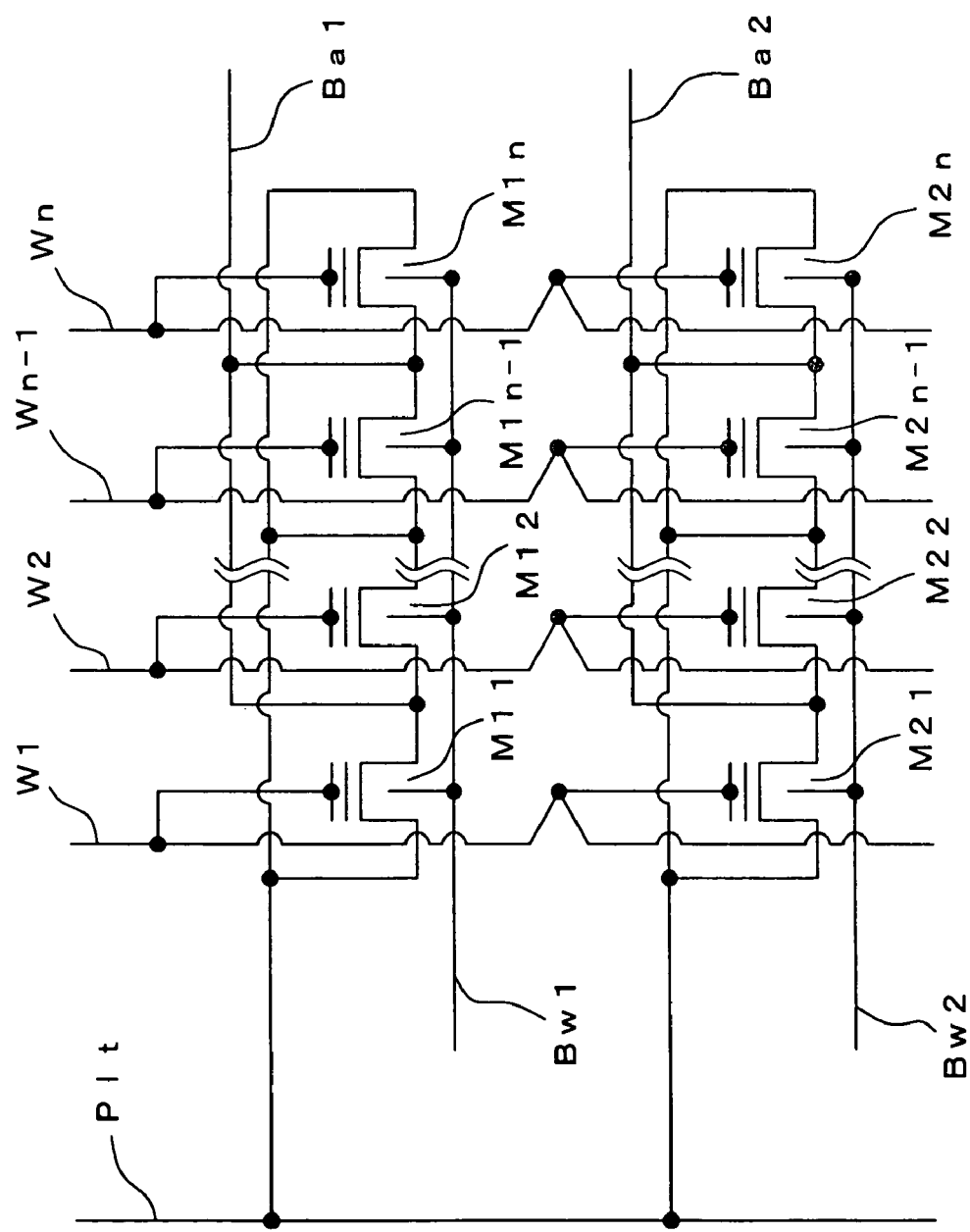
FIG. 22 is a circuit diagram of the semiconductor storage device of the sixth embodiment.

Next, circuit construction of the semiconductor storage device of this embodiment is explained with reference to FIG. 22. The memory cell array constituting this semiconductor storage device differs from the memory cell array shown in FIG. 17 of the fifth embodiment in that the shallow well region in each memory cell forms a second bit line. This second bit line Bw is paired with a first bit line Ba to form a bit line pair, and memory cells M are connected in parallel to this bit line pair, forming a so-called AND type array. It is noted that in FIG. 22, for example, a first bit line is expressed as Ba1 and a first second bit line is expressed as Bw1. The rest of the circuit construction is the same as in the memory cell array shown in FIG. 17 of the fifth embodiment.

By comparison, the circuit construction of the fifth embodiment is incapable of random access (1-bit basis write and erase operations). As for the reason of this, since the well region 42 and the source/drain region 44 cannot be put into a forward-biased state therebetween (PN forward current flows), it is impossible to apply such a bias that only one bit is selectively chosen in the case where the well region 42 is shared by all the memory cells M. However, in the case of the memory cell array of this embodiment, the additional provision of the second bit lines Bw makes the 1-bit basis write and erase implementable.

Further, in order to reduce the leakage of storage charges from the floating gate 68 of the memory cell M, the floating gate 68 in some cases may be formed of discrete dots or a charge-trapping film. However, in the case where the well region 42 is common to all the memory cells M as in the foregoing fifth embodiment, it is impossible to perform write operations with the use of discrete dots or a charge-trapping film as the floating gate 46. As for the reason of this, since a high voltage is applied only to between the control gate 45 and the drain region 44 in the write operation, only electrons close to the drain region 44 are pulled out because of the unlikeliness of leakage of storage charges, conversely unfortunately. However, with the shallow well region 63 separated by the device isolation regions 64 and the deep well region 22 and used as the second bit lines Bw as in this embodiment, it becomes implementable to perform selective write and selective erase operations also for memory cells using discrete dots or a charge-trapping film as the floating gate 68. This is because the shallow well regions 63 are formed into independent second bit lines Bw and independent voltages can be given to the shallow well regions 63 of the individual memory cells M, respectively.

In this embodiment, by virtue of the use of a bulk substrate, a large degree of freedom is allowed for the design of the shallow well regions 63 constituting the second bit lines Bw, so that depth and dopant level of the shallow well regions 63 can be set freely. Therefore, it becomes possible to provide a sufficient depth of the shallow well regions 63, provide a relatively light dopant level of proximities (channel regions) to the surface of the shallow well regions 63 for obtainment of a proper threshold for the device, and provide a heavy dopant level at relatively deep regions of the shallow well regions 63. By doing so, the resistance of the shallow well regions 63 can be made low, so that the memory can be operated at high speed.

An important thing in this embodiment is that the well region is separated into the deep well region 62 and the shallow well region 63, by which the second bit line Bw formed of the shallow well region 63 is provided. By the provision of this second bit line Bw, it becomes implementable to perform the write, erase and read operations with only 1 bit selected at random. Further, as detailed later, it also becomes possible to use discrete dots or a charge-trapping film as the floating gate 68.

As in the case of the semiconductor storage device of the fifth embodiment, it is also possible that the memory, which is the semiconductor storage device of this embodiment, and the logic circuit are compositely mounted on one integrated circuit. Otherwise, it is further possible that other memories (DRAM, SRAM, etc.) are also mounted compositely in addition to the memory, which is the semiconductor storage device of this embodiment, and the logic circuit. In that case, larger areas can be ensured for the logic circuit or other memories in proportion to the extent to which the area occupied by the memory that is the semiconductor storage device of this embodiment can be decreased as described above, making it possible to achieve functional improvement. Otherwise, in proportion to the extend to which the area occupied by the memory that is the semiconductor storage device of this embodiment can be decreased, larger storage capacity can be allocated for the memory as the occupation area remains the same as conventional. In that case, for example, it becomes implementable to write a large-scale program temporarily, hold the program even after the turn-off of power, and execute the program also after the reentry of power, and moreover to replace the program with another program.

Next, the procedure for fabricating the semiconductor storage device of this embodiment is explained. The fabrication procedure of the semiconductor storage device of this embodiment differs from the fabrication procedure of the semiconductor storage device of the fifth embodiment in that two steps for the formation of the N-type deep well region 62 and the formation of the P-type shallow well region 63 are required in the formation of the well region. The junction depth between of the N-type deep well region 62 and the P-type shallow well region 63 is determined depending on the injection conditions (injection energy and injection amount) of dopants and subsequent thermal processes (annealing process, thermal oxidation process, etc.). These dopant injection conditions and thermal process conditions, as well as the depth of the device isolation regions 64 need to be set so that the P-type shallow well regions 63 are isolated from each other by the device isolation regions 64.

In the semiconductor storage device of this embodiment, as in the case of the fifth embodiment, the area of one cell is $4F^2$, smaller than that of the conventional AND type memory cell array. Therefore, higher integration becomes implementable, the product yield improves, and the manufacturing cost can be reduced.

Furthermore, in the case of the semiconductor storage device of this embodiment, 1-bit basis erase is enabled, and the random access is enabled. Thus, there are no restrictions on the access method, so that the application to products is facilitated.

Furthermore, in the semiconductor storage device of this embodiment, it becomes possible to use discrete dots or a charge-trapping film as the floating gate 68. Therefore, low voltage drive or the like is enabled so that a memory characteristic improvement becomes achievable.

Still further, in the semiconductor storage device of this embodiment, since the depth and dopant level of the shallow well regions 63 can be set freely by virtue of the use of a bulk substrate, it becomes easier to lower the resistance of the shallow well regions 63, making it easier to raise the signal transfer of the second bit lines Bw, so that the memory can be operated at high speed.

Also, in the case where the memory that is the semiconductor storage device of this embodiment, a logic circuit and other memories (DRAM, SRAM, etc.) are compositely mounted to form an integrated circuit, the degree of integration of the integrated circuit can be enhanced and functional improvement can be achieved.

Now write and erase operations of the semiconductor storage device of this embodiment are explained below with reference to FIG. 22. As an example, it is assumed that a state of low threshold of the memory cell is a write state, while a state of high threshold is an erase state.

First, for a write operation into the memory cell M12, a negative voltage (e.g., −14 V) is applied to a selected word line W2, and a ground voltage (0 V) is applied to selected first bit line Ba1 and second bit line Bw1. In this case, the selected first bit line Ba1 may be set open. The plate electrode Pit is set to ground voltage (0 V). A negative voltage (e.g., −7 V) is applied to non-selected word lines W and second bit lines Bw. By doing so, a high voltage is applied only to between the control gate 67 of the memory cell M12 and the P-type shallow well region 63, so that electrons are ejected from the floating gate 68 to the channel region by FN tunneling, by which the 1-bit write operation is accomplished.

On the other hand, for erasing the memory cell M12, a positive voltage (e.g., 9 V) is applied to the selected word line W2, a negative voltage (e.g., −9 V) is applied to the selected first bit line Ba1, and a negative voltage (e.g., –9 V) is applied to the selected second bit line Bw1. In this case, the plate electrode Plt is set to ground voltage (0 V). The ground voltage (0 V) is applied to non-selected word lines W and second bit lines B. By doing so, a high voltage is applied only to between the control gate 67 of the memory cell M12 and the P-type shallow well region 63, so that electrons are injected from the channel region to the floating gate 68 by FN tunneling, by which the 1-bit erase operation is accomplished. The set voltages of individual nodes for write and erase operations are not limited the above voltages.

Figure 23:
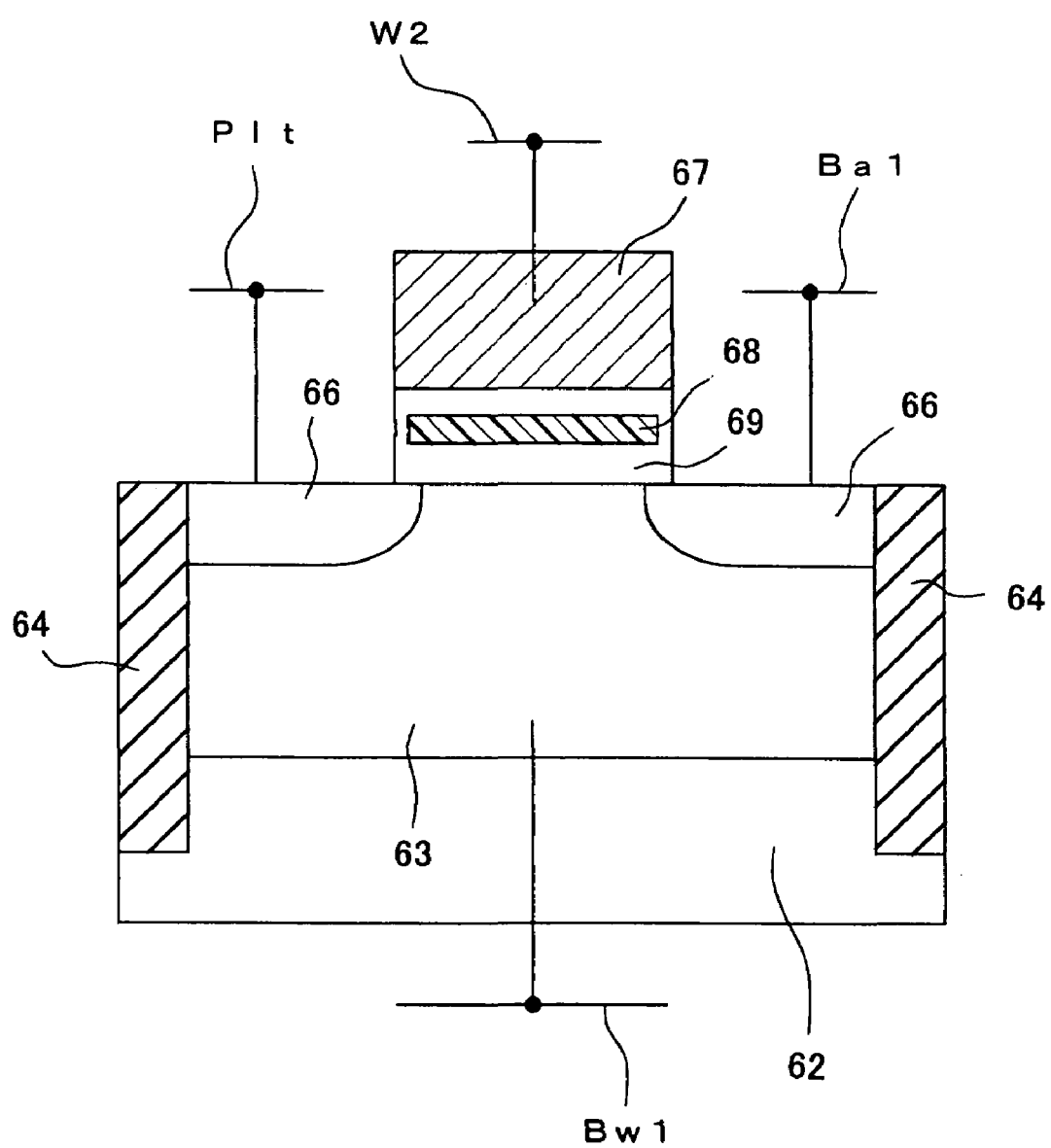
FIG. 23 is a sectional view of a memory cell in another modification of the sixth embodiment.

Furthermore, the injection and ejection of electrons may occur from the control gate (word line) 67 side. In that case, for example, as shown in FIG. 23, the film thickness of the dielectric film (silicon oxide film) 69 between the channel region and the floating gate 68 may appropriately be set thicker than the film thickness of the dielectric film between the floating gate 68 and the control gate 67. For instance, the film thickness of the dielectric film 69 is set to 7 nm to 15 nm, and the film thickness of the dielectric film between the floating gate 68 and the control gate 67 is set to 3 nm to 10 nm. Otherwise, the material of the dielectric film between the floating gate 68 and the control gate 67 may be given by a material which is relatively lower in barrier than the dielectric film 69. For instance, when the dielectric film 69 is formed of oxide and the dielectric film between the floating gate 68 and the control gate 67 is formed of silicon nitride, electric charges can be injected and ejected from the control gate 67 side to the floating gate 68 even with the two dielectric films equal in thickness to each other. It is noted here that, the cross section of the memory cell is schematically represented in FIG. 23, where the direction of the device isolation regions 64 is depicted in a way different from the actual one and the silicon substrate 61 is omitted.

Further, the above-described operation method can be applied also to the case where the injection and ejection of electrons occurs from the control gate (word line) 67 side. However, write operation and erase operation are reversed relative to the foregoing case where the injection and ejection of electrons occurs from the channel region side.

By operating the semiconductor storage device of this embodiment in the way described above, it becomes implementable to perform random access.

Seventh Embodiment

This embodiment relates to a semiconductor storage device in which fine particles (hereinafter, referred to as "discrete dots") composed of a semiconductor or conductor having a size of the nanometer (nm) order are used as the floating gate 8 in the semiconductor storage device of the foregoing sixth embodiment. The basic structure of the memory cell array in the semiconductor storage device of this embodiment is similar to that of FIGS. 18 and 19 or FIGS. 20 and 21. Also, its circuit diagram is entirely the same as that of FIG. 22. Therefore, the description of basic structure and circuit operation of the memory cell array is omitted.

Figure 24:
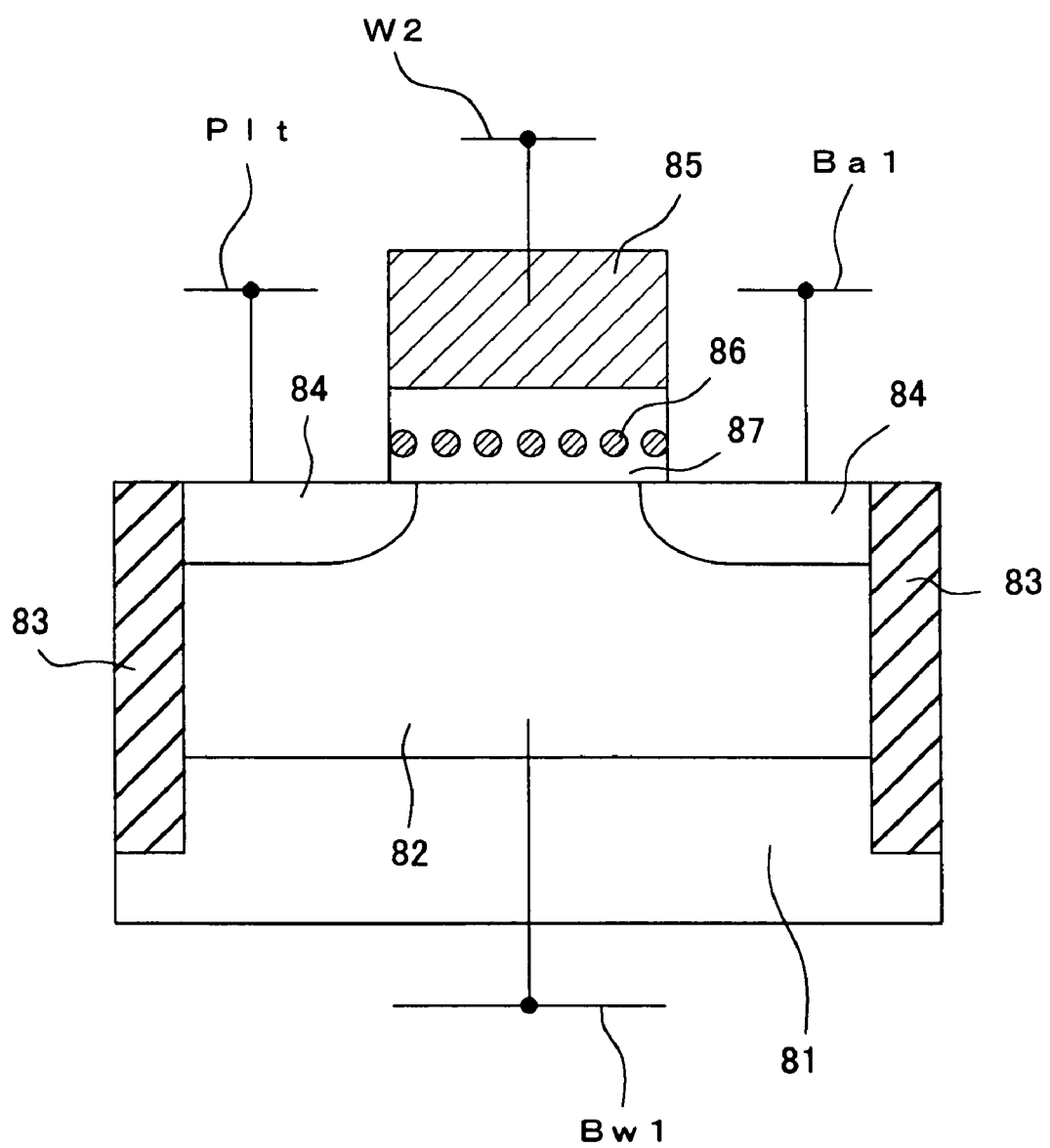
FIG. 24 is a sectional view of a memory cell in a semiconductor storage device of a seventh embodiment.

FIG. 24 is a schematic sectional view of a memory cell M12 in a memory cell array corresponding to FIG. 23 of the sixth embodiment. N-type deep well region 81, P-type shallow well region 82, device isolation regions 83, $N^+$ diffusion layers 84, control gate 85, word line W2, first bit line Ba1, second bit line Bw1 and plate electrode Plt are identical to the N-type deep well region 62, the P-type shallow well regions 63, the device isolation regions 64, the $N^+$ diffusion layers 66, the control gate 67, the word line W2, the first bit line Ba1, the second bit line Bw1 and the plate electrode Plt, respectively, in FIG. 23 of the foregoing sixth embodiment.

At an intermediate portion between the channel region and the control gate 85 in a dielectric film (silicon oxide film) 87 that separates the channel region of the P-type shallow well region 82 and the control gate 85 from each other, discrete dots 86 that serve as the floating gate are formed in a scattered form. In this case, the discrete dots 86 is exemplified by dots of a conductor or semiconductor formed in a discrete manner in the dielectric film 87. For example, silicon dots or metal dots formed in silicon oxide film can be mentioned.

Operation of the memory cell array using the discrete dots 86 as the floating gate is explained below. In the following description, as an example, it is assumed that a state of low threshold of the memory cell M is a write state, while a state of high threshold is an erase state, and that the injection and ejection of electrons occurs from the channel side. In addition, write operation and erase operation are reversed when the injection and ejection of electrons occurs from the control gate (word line W) 85 side.

Referring to FIG. 24, for a write operation into the memory cell M12, a negative voltage (e.g., –6 V) is applied to the word line W2, and a ground voltage (0 V) is applied to the first bit line Ba1 and the second bit line Bw1. In this case, the plate electrode Plt is set to ground voltage (0 V). That is, –6 V is applied to the control gate 85 of the memory cell M12, and 0 V is applied to the source region and the P-type shallow well region 82. In this case, a negative voltage (e.g., –3 V) is applied to non-selected word lines, the first and second bit lines. By doing so, a high voltage is applied only to between the control gate 85 of the memory cell M12 and the source/drain region and P-type shallow well region 82 connected to the first bit line Ba1, by which the write operation is accomplished.

Further, for erasing the memory cell M12, it is appropriate to apply a high voltage only to between the control gate 85 of the memory cell M12 and the source/drain region and P-type shallow well region 82 connected to the first bit line Ba1. That is, it is appropriate that a positive voltage (e.g., 3 V) is applied to the selected word line W2 while a negative voltage (e.g., –3 V) is applied to the source/drain region (selected first bit line Ba1) and P-type shallow well region (selected second bit line Bw1) connected to the first bit line Ba1. Thus, it becomes implementable to perform write and erase operations on the 1-bit basis also for memory cells using the discrete dots 86 as the floating gate. Also, for a read operation, for example, it is appropriate to apply 0 V to the selected word line W2, –1 V to the selected first bit line Ba1, and –1 V to the selected second bit line Bw1.

It is noted that the set voltages of individual nodes for write, erase and read operations are not limited to the above voltages. In the case of a memory membrane structure using direct tunneling, the set voltages for individual nodes can be set lower than those of the above-described example.

Next, the fabrication procedure of the semiconductor storage device of this embodiment is explained. The fabrication procedure of the semiconductor storage device of this embodiment differs from the fabrication procedure of the sixth embodiment only in the fabrication procedure of the floating gate. The floating gate in the form of discrete dots can be formed, for example, by the following procedure.

That is, after the formation of up to the tunnel oxide film constituting lower part of the dielectric film 87 in the same manner as in the fabrication procedure of the sixth embodiment, silicon microcrystal is formed on the tunnel oxide film by LPCVD process, by which discrete dots 86 are formed. After that, oxide film is formed by CVD process. It is noted that the discrete dots 86 may be either arrayed regularly or arranged randomly. Further, the discrete dots 86 may also be arrayed three-dimensionally.

As shown above, according to the semiconductor storage device of this embodiment, since the discrete dots 86 are used as the floating gate, the leakage of storage charges is reduced as compared with the flash memories of the fifth and sixth embodiments in which conductor film is used as the floating gate. Therefore, device reliability can be improved. Also, in the case where quantum dot memory-functional film, which is one mode of memory-functional film using discrete dots 86, direct tunneling can be used for write and erase operations, so that device deterioration can be suppressed by low voltage operation and its reliability can be improved.

Eigth Embodiment

This embodiment relates to a semiconductor storage device in which discrete dots formed into a plurality of layers are used as the floating gate 68 in the semiconductor storage device of the foregoing sixth embodiment. The basic structure of the memory cell array in the semiconductor storage device of this embodiment is similar to that of FIGS. 18 and 19 or FIGS. 20 and 21. Also, its circuit diagram is entirely the same as that of FIG. 22. Therefore, the description of basic structure and circuit operation of the memory cell array is omitted.

Figure 25:
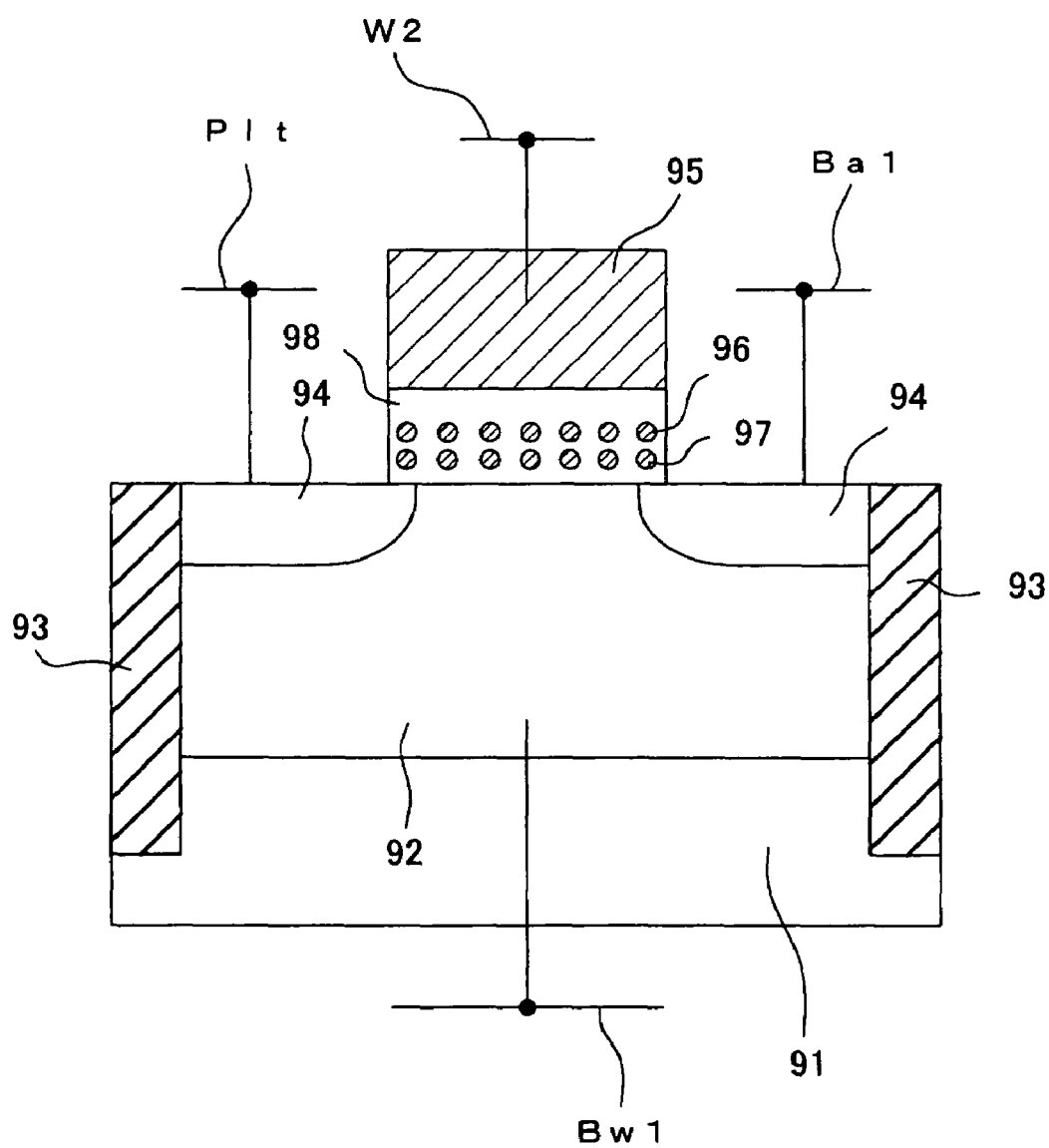
FIG. 25 is a sectional view of a memory cell in a semiconductor storage device of an eighth embodiment.

FIG. 25 is a schematic sectional view of a memory cell M12 in a memory cell array corresponding to FIG. 23 of the sixth embodiment. N-type deep well region 91, P-type shallow well region 92, device isolation regions 93, N$^+$ diffusion layers 94, control gate 95, word line W2, first bit line Ba1, second bit line Bw1 and plate electrode Plt are identical to the N-type deep well region 62, the P-type shallow well regions 63, the device isolation regions 64, the N$^+$ diffusion layers 66, the control gate 67, the word line W2, the first bit line Ba1, the second bit line Bw1 and the plate electrode Plt, respectively, in FIG. 23 of the foregoing sixth embodiment.

At an intermediate portion between the channel region and the control gate 95 in a dielectric film (silicon oxide film) 98 that separates the channel region of the P-type shallow well region 92 and the control gate 95 from each other, discrete dots 96, 97 that serve as the floating gate are formed in two layers. According to this structure, double tunnel junction is formed by a tunnel junction formed between the channel region and the lower-layer discrete dots 97 and a tunnel junction formed between the lower-layer discrete dots 97 and the upper-layer discrete dots 96. Therefore, even if the charge-tunneling process is direct tunneling, a remarkable memory effect can be produced. That is, according to this embodiment, the charge memory effect of the floating gate can be increased as compared with the seventh embodiment. It is noted that the injection and ejection of electrons may occur either from the channel region side or from the control gate 95 side.

Furthermore, although the number of layers of discrete dots constituting the floating gate has been set to "2" in this embodiment, yet the present invention is not limited to this.

Ninth Embodiment

This embodiment relates to a semiconductor storage device in which a charge-trapping film for trapping electric charges is used as the floating gate 68 in the semiconductor storage device of the foregoing sixth embodiment. The basic structure of the memory cell array in the semiconductor storage device of this embodiment is similar to that of FIGS. 18 and 19 or FIGS. 20 and 21. Also, its circuit diagram is entirely the same as that of FIG. 22. Therefore, the description of basic structure and circuit operation of the memory cell array is omitted.

Figure 26:
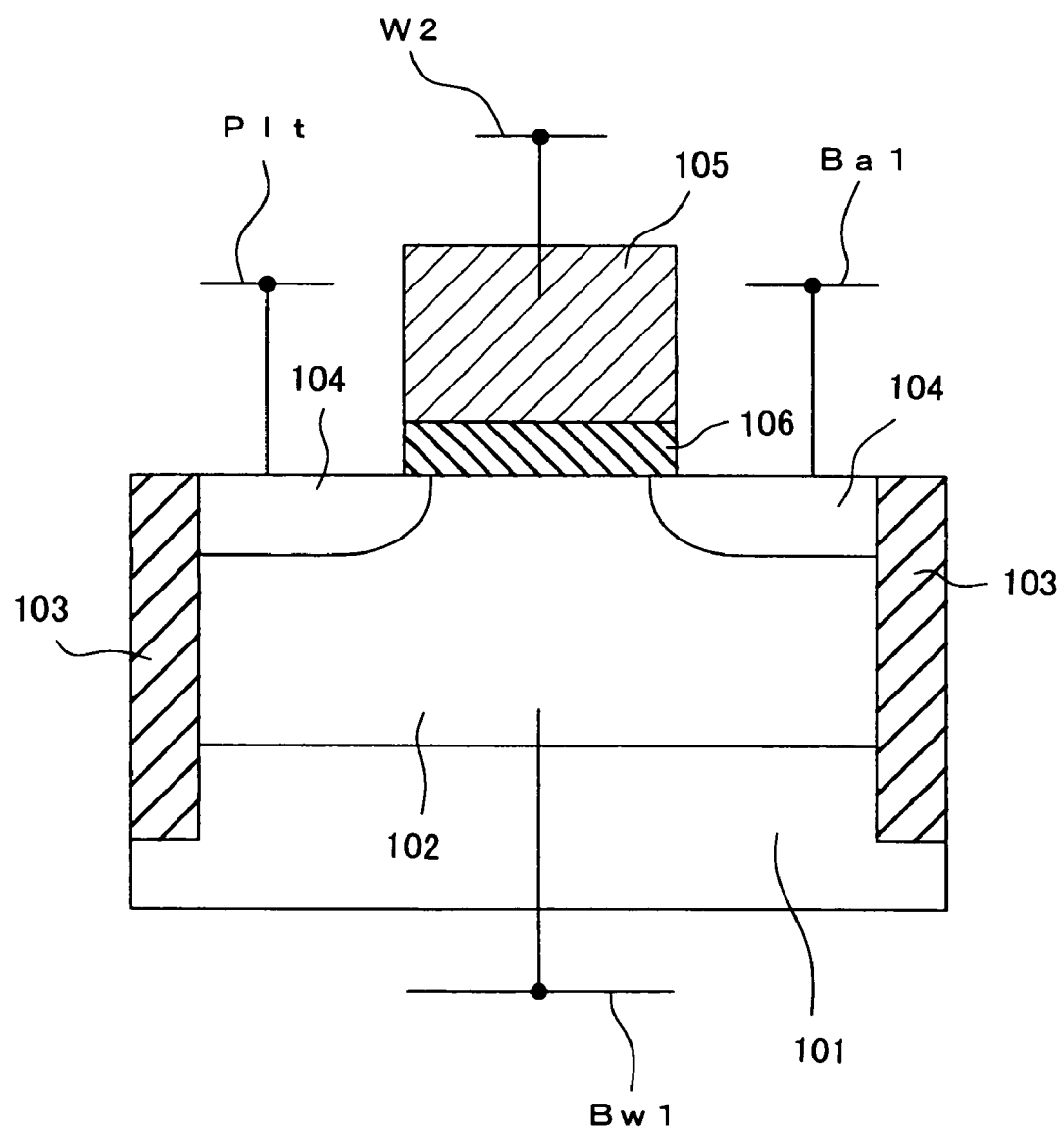
FIG. 26 is a sectional view of a memory cell in a semiconductor storage device of a ninth embodiment.

FIG. 26 is a schematic sectional view of a memory cell M12 in a memory cell array corresponding to FIG. 23 of the sixth embodiment. N-type deep well region 101, P-type shallow well region 102, device isolation regions 103, N$^+$ diffusion layers 104, control gate 105, word line W2, first bit line Ba1, second bit line Bw1 and plate electrode Plt are identical to the N-type deep well region 62, the P-type shallow well regions 63, the device isolation regions 64, the N$^+$ diffusion layers 66, the control gate 67, the word line W2, the first bit line Ba1, the second bit line Bw1 and the plate electrode Plt, respectively, in FIG. 23 of the foregoing sixth embodiment.

Between the channel region of the P-type shallow well region 102 and the control gate 105 is formed a charge-trapping film 106 that serves as the floating gate. The semiconductor storage device of this embodiment is enabled to perform selective write and selective erase operations on the 1-bit basis, for the same reason as described in the sixth embodiment.

In this case, the charge-trapping film 106 is, for example, $Si_2N_4/SiO_2$ film or $SiO_2/Si_2N_4/SiO_2$ film (ONO film). Devices using this are exemplified by, for example, MNOS, SNOS, SONOS or the like. Also, when the ONO film is used, the charge-trapping efficiency is increased so that memory characteristics can be improved, as compared to when the $Si_2N_4/SiO_2$ film is used. Although silicon nitride film is given by $Si_2N_4$ and silicon oxide film is given by $SiO_2$ in this case, yet the individual component ratios are not limited by these. Also, ferroelectric memory film having hysteresis characteristics may also be used instead of the charge-trapping film 106.

Operation of the semiconductor storage device using the charge-trapping film 106 instead of the floating gate is similar to, for example, the operation of the semiconductor storage device of the sixth embodiment. It is preferable, however, that the set voltages of individual nodes for write, erase and read operations are given by optimum values selected according to the charge-trapping film 106.

Next, the fabrication procedure of the semiconductor storage device of this embodiment is explained. The fabrication procedure of the semiconductor storage device of this embodiment differs from the fabrication procedure of the sixth embodiment only in the fabrication procedure of the floating gate. The charge-trapping film 106 can be formed, for example, by the following procedure.

That is, after the formation of the device isolation regions 103, the N-type deep well region 101 and the P-type shallow well region 102 in the same manner as in the fabrication procedure of the sixth embodiment, a charge-trapping film 106 is formed on the P-type shallow well region 102 instead of the floating gate by a combinational process of thermal oxidation process and CVD film deposition process.

With a charge-trapping film used for holding of electric charges, the leakage of storage charges is reduced as compared with the flash memories of the fifth and sixth embodiments in which conductor film is used as the floating gate. Therefore, device reliability can be improved.

Tenth Embodiment

This embodiment relates to a semiconductor storage device in which a composite member of polysilicon film and multilayered discrete dots are used as the floating gate 68 in the semiconductor storage device of the foregoing sixth embodiment. The basic structure of the memory cell array in the semiconductor storage device of this embodiment is similar to that of FIGS. 18 and 19 or FIGS. 20 and 21. Also, its circuit diagram is entirely the same as that of FIG. 22. Therefore, the description of basic structure and circuit operation of the memory cell array is omitted.

Figure 27:
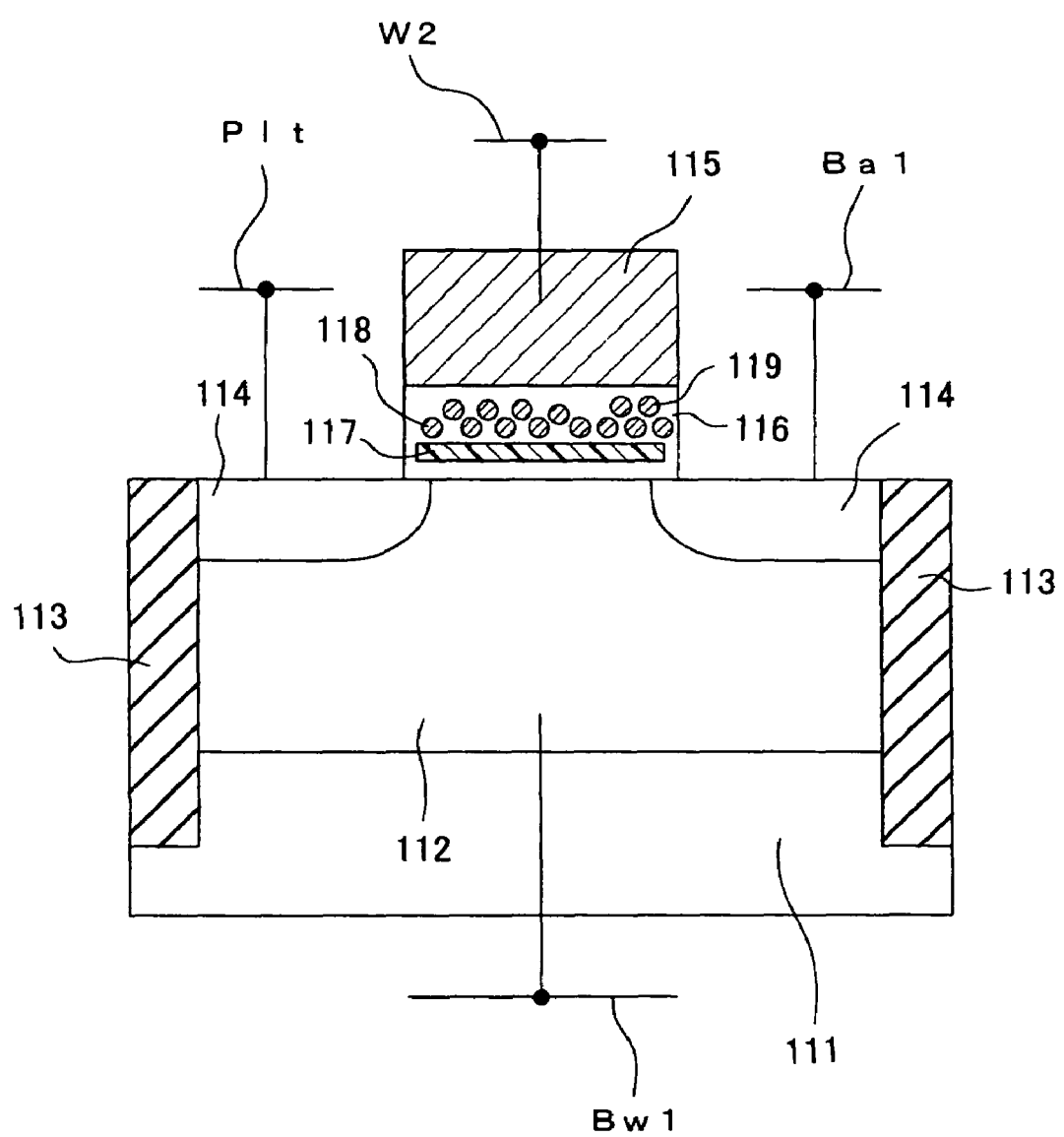
FIG. 27 is a sectional view of a memory cell in a semiconductor storage device of a tenth embodiment.

FIG. 27 is a schematic sectional view of a memory cell M12 in a memory cell array corresponding to FIG. 23 of the sixth embodiment. N-type deep well region 111, P-type shallow well region 112, device isolation regions 113, N$^+$ diffusion layers 114, control gate 115, word line W2, first bit line Ba1, second bit line Bw1 and plate electrode Plt are identical to the N-type deep well region 62, the P-type shallow well regions 63, the device isolation regions 64, the N$^+$ diffusion layers 66, the control gate 67, the word line W2, the first bit line Ba1, the second bit line Bw1 and the plate electrode Plt, respectively, in FIG. 23 of the foregoing sixth embodiment.

At an intermediate portion between the channel region and the control gate 115 in silicon oxide film 116 that separates the channel region of the P-type shallow well region 112 and the control gate 115 from each other, a polysilicon film 117 is formed on a channel region side, while discrete dots 118 composed of silicon fine particles are formed on a control gate 115 side via the silicon oxide film 116, and further discrete dots 119 composed of silicon fine particles are formed obliquely upward of the discrete dots 118 via the silicon oxide film 116.

Figure 28:
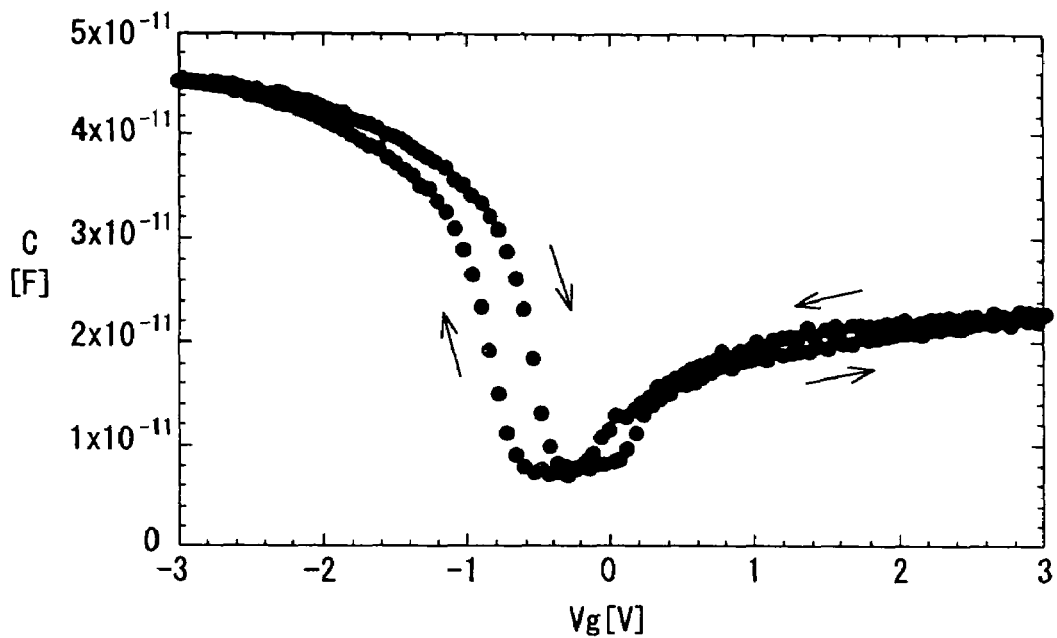
FIG. 28 is a chart showing the relationship between capacity C of the memory-functional film and applied voltage Vg (+3V→−3V→+3V) in FIG. 27.
Figure 29:
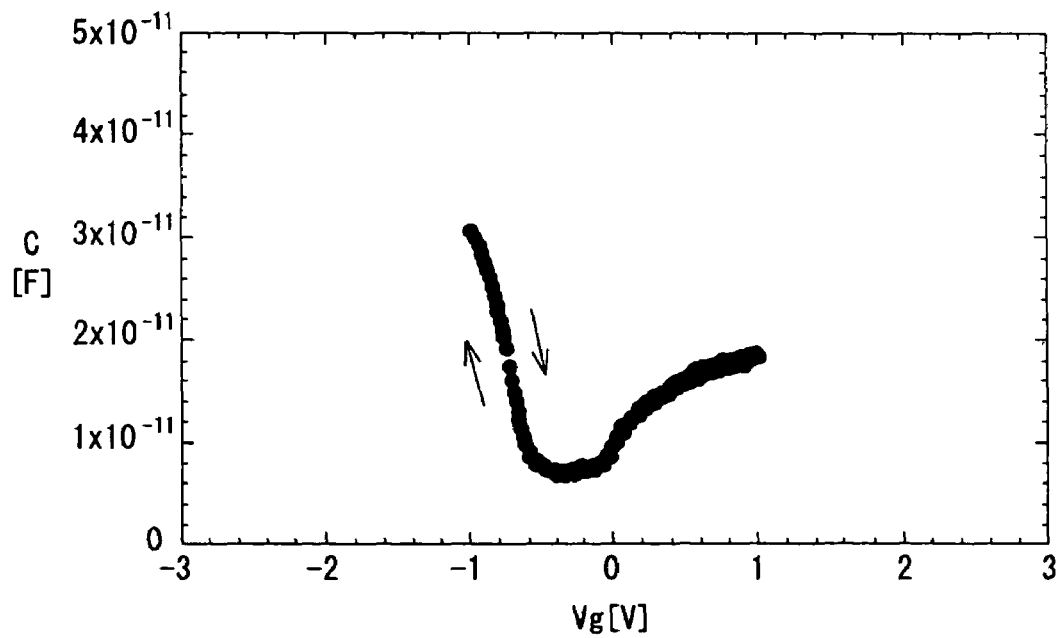
FIG. 29 is a chart showing the relationship between capacity C and applied voltage Vg (+1V→−1V→+1V) different from that of FIG. 27.

Next, characteristics of the memory-functional film having the composite-member structure of the polysilicon film 117 and the two-layered discrete dots 118, 119 are described. FIGS. 28 and 29 show relationships between capacity C of the memory-functional film and applied voltage Vg. That is, the applied voltage Vg is a voltage applied to the control gate 115 side against the shallow well region 112 side, and C refers to electrostatic capacity per unit area. FIG. 28 shows C-Vg characteristics resulting from scanning the applied voltage Vg from +3 V to −3 V and thereafter scanning the applied voltage Vg again to +3 V. FIG. 29 shows C-Vg characteristics, likewise, resulting from scanning the applied voltage Vg from +1 V to −1 V and thereafter scanning the applied voltage Vg again to +1 V.

From FIG. 28, it can be understood that a write is done on the memory-functional film when the applied voltage Vg comes to −3 V, and a hysteresis characteristic appears with the graph shifted rightward. Although not shown, when the applied voltage Vg comes to +3 V, the curve recovers, making it understood that an erase is done. It is noted that a state of increased threshold is assumed as a write in this case. On the other hand, from FIG. 29, no hysteresis characteristic appears within a range of ±1 V of applied voltage Vg, making it understood that neither write nor erase is done. As shown above, from FIGS. 28 and 29, it can be understood that according to the characteristics of the memory-functional film in this embodiment, it is implementable to perform write and erase at ±3 V as well as nondestructive read that does not cause destruction of electric charges (i.e., storage) accumulated in the memory-functional film at 1 V. Accordingly, as in the sixth embodiment in which the memory-functional film is implemented by conductor film, there is no need for applying such a high voltage as 14 V or 18 V to between the control gate 115 and the P-type shallow well region 112, so that low voltage operation becomes implementable.

Next, the fabrication procedure of the semiconductor storage device of this embodiment is explained. The fabrication procedure of the semiconductor storage device of this embodiment differs from the fabrication procedure of the foregoing sixth embodiment only in the fabrication procedure of the floating gate. The memory-functional film formed of a composite member of the polysilicon film 117 and the discrete dots 118, 119 can be formed, for example, by the following procedure.

That is, device isolation regions 113, N-type deep well region 111 and P-type shallow well region 112 are formed in the same manner as in the fabrication procedure of the sixth embodiment. Thereafter, on the P-type shallow well region 112, 2 nm silicon oxide film is formed in a 900° C. N$_2$O atmosphere. Next, polysilicon is grown by LPCVD process in a 620° C. SiH$_4$ atmosphere. By doing so, the polysilicon is grown into a layer form, by which 5 nm thick polysilicon film 117 is formed. Next, the surface of the polysilicon film 117 is oxidized by a thickness of 2 nm in a 900° C. N$_2$O atmosphere. Then, silicon is grown by LPCVD process in a 620° C. SiH$_4$ atmosphere, silicon is not grown into a layered form but formed into a dot form. In more detail, whereas polysilicon film would be grown into a layered form on an oxide film formed by thermally oxidizing a silicon single crystal substrate, silicon is formed into a dot form on an oxide film formed by thermally oxidizing polysilicon film even with the use of the same silicon growth conditions. Thus, first-layer silicon fine particles 118 are formed.

Next, by oxidation in a 900° C. N$_2$O atmosphere, the first-layer silicon fine particles 118 are oxidized at their surfaces but have crystal silicon remaining in their interiors with diameters of about 5 nm. Then, silicon is grown by LPCVD process in a 620° C. SiH$_4$ atmosphere, by which the silicon is formed into a dot form, thus second-layer silicon fine particles 119 being formed. These second-layer silicon fine particles 119 are in large part formed in adjacency to the first-layer silicon fine particles 118. That is, the second-layer silicon fine particles 119 are in large part formed obliquely upward of the first-layer silicon fine particles 118. Next, by oxidation in a 900° C. N$_2$O atmosphere, the second-layer silicon fine particles 119 are oxidized at their surfaces but have crystal silicon remaining in their interiors with diameters of about 5 nm. After the memory-functional film is completed in this way, polysilicon film that serves as the control gate 115 is formed by LPCVD process. It is noted that the number density of silicon fine particles in a combination of the first-layer silicon fine particles 118 and the second-layer silicon fine particles 119 is about 3×10$^{11}$ cm$^{-2}$.

According to the semiconductor storage device of this embodiment, as a result of forming the floating gate of a composite member of the polysilicon film 117 and the discrete dots 118, 119, it is implementable to obtain a memory-functional film in which write is done at ±3 V while write is not done at ±1 V. Thus, it becomes implementable to perform write and erase operations as well as nondestructive read at low voltage.

Furthermore, although the number of layers of discrete dots constituting the floating gate has been set to "2" in this embodiment, yet the present invention is not limited to this.

Eleventh Embodiment

This embodiment relates to a semiconductor-storage-device drive method by which the ratio of a voltage applied to the memory-functional film of selected memory cells to a voltage applied to the memory-functional film of non-selected memory cells can be set to the largest possible one in the semiconductor storage devices of the sixth to tenth embodiments.

Generally, in write or erase operation on memory cells, a large voltage is applied to the memory-functional film of the selected memory cell. Then, some extent of voltage would inevitably be applied also to the memory-functional film of non-selected memory cells. Therefore, for prevention of malfunction, it is preferable that the ratio of a voltage applied to the memory-functional film of selected memory cells to a maximum value of voltages applied to the memory-functional film of non-selected memory cells is made as large as possible.

Generally, in a commonly practiced drive method, for example, for an erase operation, the voltage of a selected word line is set to $V_{DD}$, and the voltage of a selected bit line is set to ground voltage, and the voltage of the other word lines and bit lines is set to $V_{DD}/2$. In this case, the voltage of $V_{DD}$ is applied to the memory-functional film of selected memory cells, while the voltage of 0 or $V_{DD}/2$ is applied to the memory-functional film of non-selected memory cells. Therefore, the ratio of the voltage applied to the memory-functional film of selected memory cells to the maximum value of voltages applied to the memory-functional film of non-selected memory cells is "2".

In the drive method of the semiconductor storage device of this embodiment, applied voltages to individual word lines W and bit lines B for write and erase operations are shown in Table 2.

Table 2:

Write:

|  | Bit line B | |
| --- | --- | --- |
| Word line W | (Selected) 0 | (Non-Selected) $-(1-A) \times V$ |
| (Selected) $-V$ | Voltage applied to film: $-V$ | Voltage applied to film: $-A \times V$ |
| (Non-Selected) $-A \times V$ | Voltage applied to film: $-A \times V$ | Voltage applied to film: $(1-2A) \times V$ | where Plate electrode Plt: 0
$1/3 \leq A < 1/2$

Erase:

|  | Bit lineB | |
| --- | --- | --- |
| Word lineW | (Selected) $-V$ | (Non-Selected) $-A \times V$ |
| (Selected) 0 | Voltage applied to film: V | Voltage applied to film: $A \times V$ |
| (Non-Selected) $-(1-A) \times V$ | Voltage applied to film: $A \times V$ | Voltage applied to film: $-(1-2A) \times V$ | where Plate electrode Plt: 0
$1/3 \leq A < 1/2$

Also, applied voltages to individual word lines W and bit lines B for write and erase operations with V=3V and A=1/3 in Table 2 are shown in Table 3.

Table 3:

Write:

|  | Bit line B | |
| --- | --- | --- |
| Word line W | (Selected) 0 (V) | (Non-Selected) $-2$ (V) |
| (Selected) $-3$ (V) | Voltage applied to film: $-3$ (V) | Voltage applied to film: $-1$ (V) |
| (Non-Selected) $-1$ (V) | Voltage applied to film: $-1$ (V) | Voltage applied to film: 1 (V) | where plate electrode Plt: 0 (V)
V = 3 (V),
A = 1/3

Erase:

|  | Bit line B | |
| --- | --- | --- |
| Word line W | (Selected) $-3$ (V) | (Non-Selected) $-1$ (V) |
| (Selected) 0 (V) | Voltage applied to film: 3 (V) | Voltage applied to film: 1 (V) |
| (Non-Selected) 2 (V) | Voltage applied to film: 1 (V) | Voltage applied to film: $-1$ (V) | where plate electrode Plt: 0 (V)
V = 3 (V),
A = 1/3

In Tables 2 and 3, since it is desirable that the voltage of the plate electrode Plt be constant, numerical values in a case where the plate electrode Plt are set to 0 V at all times are described, but the present invention is not limited to this case. Also, the bit lines B in Tables 2 and 3 refer to the first bit line Ba and the second bit line Bw. Also, Tables 2 and 3 show a case where injection and ejection of electrons occurs from the channel side on the assumption that a state of low threshold of the memory cell is a write state. In addition, voltage values of write operation and erase operation are reversed when the injection and ejection of electrons occurs from the control gate (word line W) side.

As shown in Table 2, in the drive method of the semiconductor storage device of this embodiment, for a write operation, $-V$ is applied to the selected word line, $-A \times V$ is applied to non-selected word lines, 0 is applied to the selected bit line, and $-(1-A) \times V$ is applied to non-selected bit lines. Also, for an erase operation, a voltage of 0 is applied to a selected word line, $-(1-A) \times V$ is applied to non-selected word lines, $-V$ is applied to a selected bit line, and $-A \times V$ is applied to non-selected bit lines. In this case, it holds that $1/3 \leq A < 1/2$ (where a case with A=1/2 is equivalent to the case of the drive method that has hitherto been commonly practiced in terms of the voltages applied to the film).

As for the voltages for the above erase operation, the voltages for individual nodes (selected word line and non-selected word lines, as well as selected bit line and non-selected bit lines) may be set uniformly higher within such a range that the voltage for the non-selected bit lines does not exceed 0 (toward the positive side). However, if the voltage of the bit line B exceeds 0 V, there would flow a forward-junction leak current to the plate electrode Plt. The ratio of the voltage applied to the memory-functional film of a selected memory cell to the maximum value of voltages applied to the memory-functional film of non-selected memory cells becomes a maximum of 3 (in absolute value) when A=1/3. Thus, the setting of A=1/3 is most preferable. A specific value for V in Table 2 may be determined optimally according to film quality or film structure. In more detail, it is preparatorily set that injection or ejection of charges occurs when the absolute value of the voltage applied to the memory-functional film is V, while injection or ejection of charges does not occur when the absolute value of the voltage applied to the memory-functional film is A×V. In addition, for a read operation, the absolute value of the voltage applied to the memory-functional film is preferably set to not more than A×V, in which case there never occurs destruction of storage due to the read operation.

Table 3 shows a specific example of Table 2 in a case where V=3V and A=1/3. Whereas the absolute value of the voltage applied to the memory-functional film of the selected memory cell is 3 V, the absolute values of the voltages applied to the memory-functional film of non-selected memory cells are 1 V in all cases.

As described above, in the drive method of the semiconductor storage device of this embodiment, the ratio of a voltage applied to the memory-functional film of a selected memory cell to a maximum value of voltages applied to the memory-functional film of non-selected memory cells can be made larger than conventional "2," so that a memory having large operational margin can be implemented.

In addition, in this embodiment, as can be seen from Table 2, it is necessary to apply different voltages to a selected bit line and a non-selected bit line. Therefore, this embodiment cannot be applied to the fifth embodiment in which the well region is common to all the memory cells.

Twelfth Embodiment

This embodiment relates to a semiconductor storage device in which an SOI substrate is used to make up the semiconductor storage devices of the foregoing fifth to eleventh embodiments. A plan view of the semiconductor storage device of this embodiment is the same as that of FIG. 11 or FIG. 14.

Figure 30:
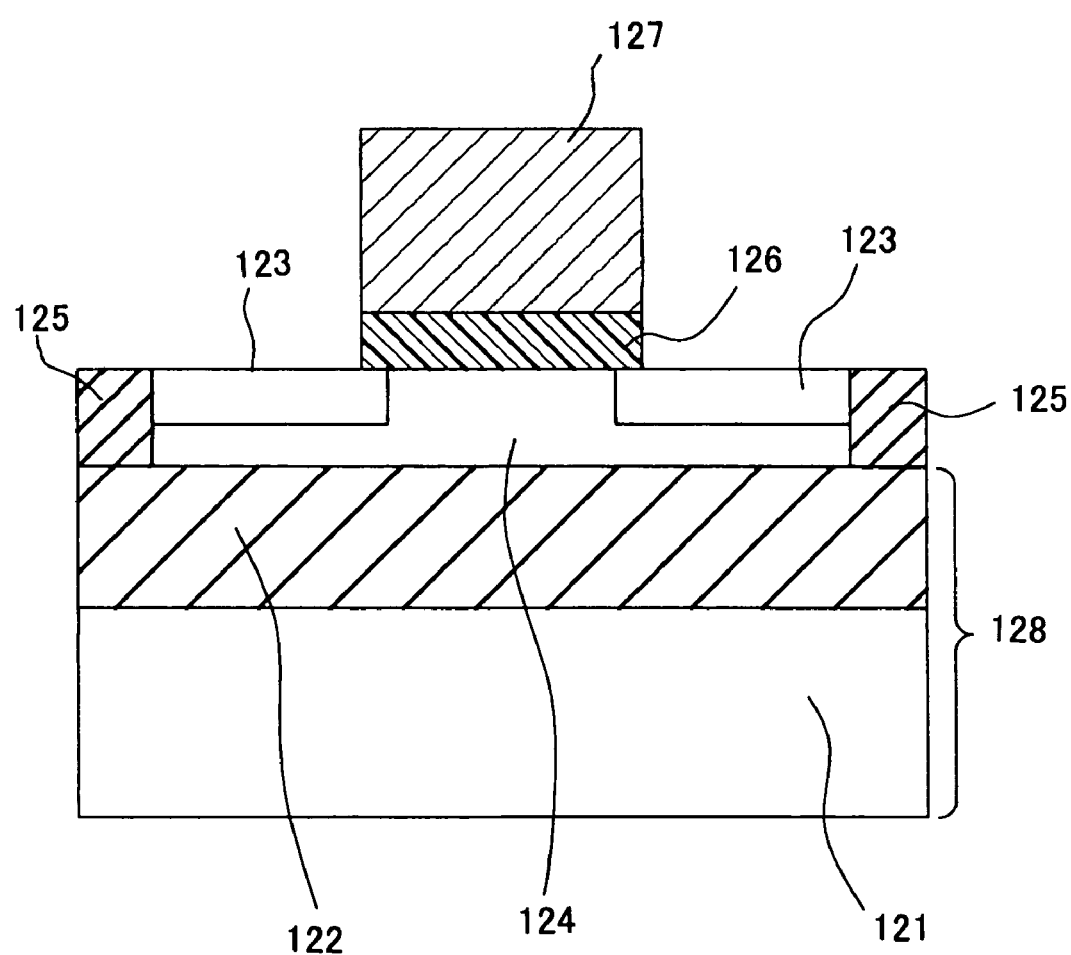
FIG. 30 is a sectional view of a memory cell in a semiconductor storage device of a twelfth embodiment.

FIG. 30 is a schematic sectional view of a memory cell in the semiconductor storage device of this embodiment. When a body 124 between N⁺ diffusion layers 123 formed on an SOI layer 128 on buried oxide film 122 stacked on a silicon substrate 121 is provided as a common body, then the semiconductor storage device operates in the same manner as in the fifth embodiment. On the other hand, if arrays of the bodies 124 isolated by the device isolation regions 125 are given independent voltages, respectively, so as to be used as second bit lines, then random access is enabled as in the sixth to tenth embodiments.

A memory-functional film 126 formed on the body 124 is a dielectric film including a floating gate of conductive film or a floating gate composed of discrete dots. Otherwise, the memory-functional film 126 may also be given by the charge-trapping film or the ferroelectric film having hysteresis characteristics. Reference numeral 127 denotes a control gate. Further, although FIG. 30 shows a case of the completely depletion type, yet a partially depletion type may also be adopted. In that case, the resistance of the body 124 that becomes the second bit line Bw can be reduced, allowing higher speed of the device to be implemented.

Next, the fabrication procedure of the semiconductor storage device of this embodiment is explained. First, dielectric device isolation regions 125 are formed in the body 124 formed on the SOI substrate 128. Subsequently, dopant injection into the body 124 is performed so that the memory device has a proper threshold. The formation of upper structure after this on is the same as in the semiconductor storage devices of the fifth to tenth embodiments.

In the semiconductor storage device of this embodiment, the following effects can be obtained in addition to the effects obtained by the semiconductor storage devices and drive method of the fifth to eleventh embodiments. That is, in the semiconductor storage device of this embodiment, for the presence of the thick buried oxide film 122, the electrostatic capacity between the body 124 and the silicon substrate 121 can be made very small. In contrast, in the semiconductor storage devices of the sixth to tenth embodiments, the electrostatic capacity between the shallow well region 63, 82, 92, 102, 112 and the deep well region 62, 81, 91, 101, 111 is quite large. Therefore, according to the semiconductor storage device of this embodiment, the consumption current for charging the capacity with respect to the above substrate can be made small, as compared with the semiconductor storage devices of the sixth to tenth embodiments. From the above reasons, the use of the SOI substrate makes it feasible to achieve power consumption reduction.

Thirteenth Embodiment

Figure 31:
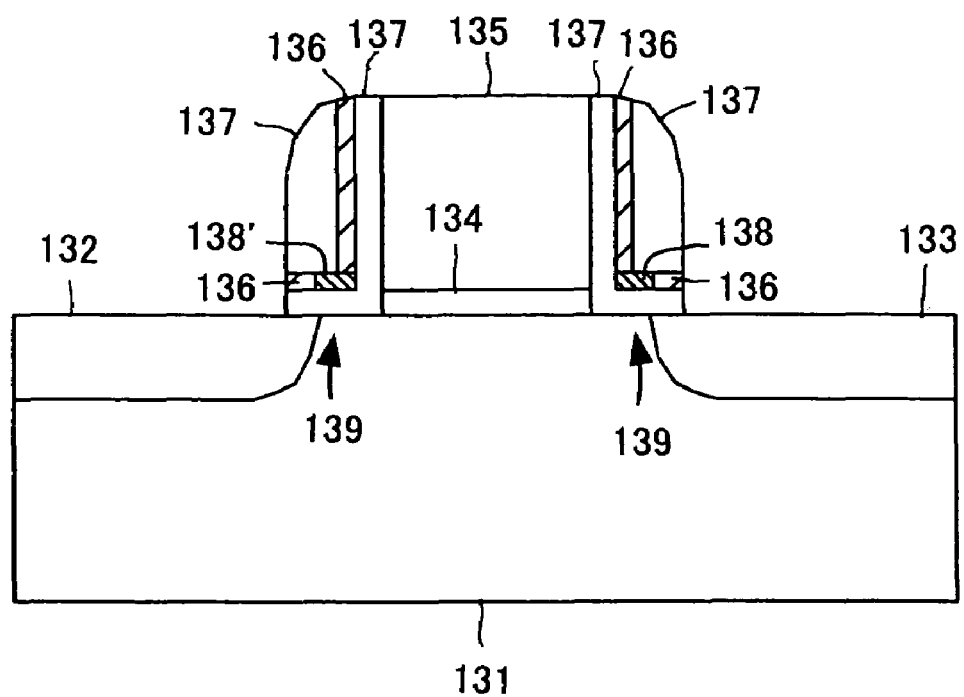
FIG. 31 is a sectional view of a memory cell in a semiconductor storage device of a thirteenth embodiment.

An embodiment of the present invention is explained below with reference to FIG. 31. This embodiment relates to a semiconductor storage device in which a film having memory function is present on a side wall of the gate electrode. Further, 2-bit operation of such a device is explained.

In a memory cell (FIG. 31) constituting the semiconductor storage device of this embodiment, an N-type first diffusion region 132 and an N-type second diffusion region 133 are formed on a surface of a P-type well 131 formed in a semiconductor substrate, and a channel region is formed between these N-type diffusion regions 132, 133 and at an uppermost layer portion of the well 131. On this channel region is formed a gate electrode 135 via a gate insulator 134 formed of silicon oxide film or silicon nitride film having a film thickness of about 1 nm to 6 nm. The gate electrode 135 does not overlap with the diffusion regions 132, 133, where there is left a slight channel region (139 in FIG. 31) that is not covered with the gate electrode 135.

In this case, the gate electrode 135 is formed of part of a word line structured in the same manner as the word line of the foregoing individual embodiments.

Figure 33:
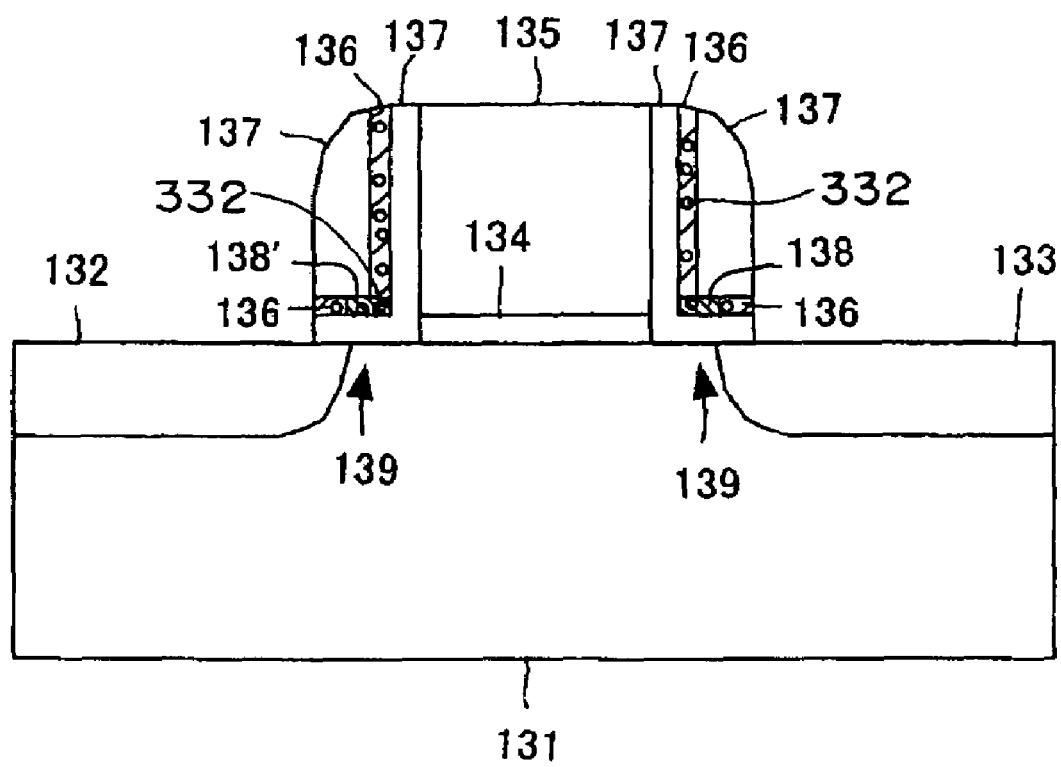
FIG. 33 is a is a sectional view of a variation of the memory cell in the semiconductor storage device of the thirteenth embodiment.

At both ends of the gate electrode 135 is formed a gate side-wall insulator. This gate side-wall insulator is made up of a charge-holding film 136 and silicon oxide film 137. The charge-holding film 136 can be given by, for example, silicon nitride film. In this semiconductor storage device, it is portions of charge accumulating regions 138', 138 in the charge-holding film 136 that electric charges are actually accumulated or trapped to hold storage. Alternately, as illustrated in FIG. 33, charge-holding film 136 may include fine particles 332 formed of semiconductor or conductor material for accumulating charge.

Next, the principle of write operation in this semiconductor storage device is explained. It is assumed here that write refers to injecting electrons into the charge-holding film. In order to inject (write) electrons into the charge accumulating region 138 of the charge-holding film 136, the first diffusion region 132 is assigned for the source electrode, and the second diffusion region 133 is assigned for the drain electrode. For instance, it is appropriate that 0 V is applied to the first diffusion region 132 and the well 131, +6 V is applied to the second diffusion region 133, and +2 V is applied to the gate electrode 135. According to such voltage conditions, an inversion layer extends from the first diffusion region 132 (source electrode), but does not reach the second diffusion region 133 (drain electrode), causing occurrence of a pinch-off point. Electrons are accelerated by a high electric field from the pinch-off point to the second diffusion region 133 (drain electrode), resulting in so-called hot electrons. These hot electrons are injected into the charge accumulating region 138, by which write is done. It is noted that in the neighborhood of the charge accumulating region 138', hot electrons are not generated and therefore write is not done.

As shown above, write can be accomplished by injecting electrons into the charge accumulating region 138.

On the other hand, in order to inject (write) electrons into the charge accumulating region 138', the second diffusion region 133 is assigned for the source electrode, and the first diffusion region 132 is assigned for the drain electrode. For instance, it is appropriate that 0 V is applied to the second diffusion region 133 and the well 131, +6 V is applied to the first diffusion region 132, and +2 V is applied to the gate electrode 135. Like this, in a case of injecting electrons into the charge accumulating region 138, the source region and the drain region can be replaced with each other so that electrons can be injected into the charge accumulating region 138', by which write can be done.

Next, the principle of read operation in this semiconductor storage device is explained. In order to read information stored in the charge accumulating region 138', the first diffusion region 132 is assigned for the source electrode, while the second diffusion region 133 is assigned for the drain electrode, and the transistor is put into a saturation region operation. For instance, it is appropriate that 0 V is applied to the first diffusion region 132 and the well 131, +2 V is applied to the second diffusion region 133, and +1 V is applied to the gate electrode 135. In that case, if electrons have not been accumulated in the charge accumulating region 138', the drain current easily flows. If electrons have been accumulated in the charge accumulating region 138', on the other hand, the inversion layer is less easily formed in the neighborhood of the charge accumulating region 138', so that the drain current less easily flows. Therefore, stored information of the charge accumulating region 138' can be read by detecting the drain current. In this operation, the presence or absence of accumulated charges in the charge accumulating region 138 does not affect the drain current because the neighborhood of the drain is pinched off.

Also, for reading the information stored in the charge accumulating region 138, the second diffusion region 133 is assigned for the source electrode, the first diffusion region 132 is assigned for the drain electrode, and the transistor is put into a saturation region operation. For instance, it is appropriate that 0 V is applied to the second diffusion region 133 and the well 131, +2 V is applied to the first diffusion region 132, and +1 V is applied to the gate electrode 135. Like this, information stored in the charge accumulating region 138 can be read by replacing the source region and the drain region with each other in reversal to the case of reading information stored in the charge accumulating region 138'.

Furthermore, in the case where there is left a channel region 139 that is not covered with the gate electrode 135, an inversion layer is dissipated or formed in the channel region that is not covered with the gate electrode 135 depending on the presence or absence of excess electrons of the charge accumulating regions 138', 138, so that a large hysteresis (threshold change) is obtained. However, if the channel region 139 that is not covered with the gate electrode 135 is too large in width, the drain current would decrease to a large extent, resulting in a large reduction in read speed. Therefore, preferably, the width of the channel region 139 that is not covered with the gate electrode 135 is determined so that sufficient hysteresis and read speed can be obtained.

In the case where the diffusion regions 132, 133 extent to reach an end of the gate electrode 135, that is, where the diffusion regions 132, 133 and the gate electrode 135 overlap each other, the threshold value of the transistor is hardly changed by the write operation, but the parasitic resistance at source end and drain end is largely changed, so that the drain current largely decreases (to one order or more). Therefore, read operation can be done by detecting the drain current, thus allowing a memory function to be obtained. However, when even larger memory hysteresis effect is needed, it is preferable that the diffusion regions 132, 133 and the gate electrode 135 do not overlap each other.

Further, the principle of read operation in this semiconductor storage device is explained.

First, as a first method, for erasing information stored in the charge accumulating region 138', it is appropriate that a positive voltage (e.g., +6 V) is applied to the first diffusion region 132, 0 V is applied to the well 131, a reverse bias is applied to the PN junction between the first diffusion region 132 and the well 131, and moreover a negative voltage (e.g., −5 V) is applied to the gate electrode 135. In this case, in the PN junction in the neighborhood of the gate insulator, in particular, the potential gradient becomes steeper due to an effect of the gate electrode 135 to which the negative voltage is applied. As a result, hot holes are generated on the well region 131 side of the PN junction by interband tunneling. These hot holes are pulled in toward the gate electrode 135 having a negative voltage, so that hole injection into the charge accumulating region 138' is performed. In this way, erase operation of the charge accumulating region 138' is carried out. In this case, 0 V may appropriately be applied to the second diffusion region 133.

Also, for erasing information stored in the charge accumulating region 138, the voltages of the first diffusion region 132 and the second diffusion region 133 may be replaced with each other in the above-described case of erasing information stored in the charge accumulating region 138'.

As a second method, for erasing information stored in the charge accumulating region 138', it is appropriate that a positive voltage (e.g., +5 V) is applied to the first diffusion region 132, 0 V is applied to the second diffusion region 133, a negative voltage (e.g., −4 V) is applied to the gate electrode 135, and a positive voltage (e.g., 0.8 V) is applied to the well 131. In this case, a forward voltage is applied to between the well 131 and the second diffusion region 133, so that electrons are injected into the well 131. The injected electrons are diffused up to the PN junction between the well 131 and the first diffusion region 132, where the electrons are accelerated by an intense electric field, resulting in hot electrons. These hot electrons make electron-hole pairs generated in the PN junction. Part of the electrons and holes generated in this way, to which further energy is imparted by the electric field, makes new electron-hole pairs generated. Thus, even more electron-hole pairs are generated in the PN junction between the well 131 and the first diffusion region 132. That is, by applying a forward voltage to between the well 131 and the second diffusion region 133, electrons injected into the well 131 act as a trigger for the yield of the PN junction placed on the opposite side. Then, the hot holes generated in the PN junction are pulled in toward the gate electrode 135 having a negative voltage, by which hole injection into the charge accumulating region 138' is done.

According to this second method, in the PN junction between the well 131 and the first diffusion region 132, even with the application of only a voltage that is insufficient to make hot holes generated by interband tunneling, electrons injected from the second diffusion region 133 act as a trigger for the yield of the PN junction, so that hot holes can be generated. Thus, the voltage for erase operation can be lowered.

Furthermore, for erasing information stored in the charge accumulating region 138', whereas +6 V has to be applied to the first diffusion region 132 in the first erase method, +5 V suffices in the second erase method. Thus, according to the second method, the voltage for erase operation can be reduced. Therefore, power consumption can be reduced, and deteriorations of the semiconductor storage device due to hot carriers can be suppressed.

By the above-described operational method, write and erase operations of selective two bits per transistor become implementable.

According to the semiconductor storage device of this embodiment, since a film having memory function is present on the side wall of the gate electrode 135, the gate insulator 134 itself does not need to have the memory effect. Therefore, the gate insulator 134 can be easily formed into a thinner film, so that the short-channel effect can be easily suppressed. Further, the film having memory function is separated effectively by the gate electrode 135, so that 2-bit operation can be easily implemented. Therefore, micro-finer implementation and cost reduction of the semiconductor storage device can be easily achieved.

In addition, in this embodiment, the memory cell is formed on the P-type well 131 formed in a semiconductor substrate. Otherwise, the memory cell may be formed on a semiconductor substrate.

Furthermore, the present invention is not limited to the above individual embodiments, and those embodiments may be combined without problems. For instance, the first bit lines 12 in the first embodiment (FIGS. 1 to 4) and the second embodiment (FIG. 6) may well be replaced with plates similar to the plates 48, 70 in the fifth embodiment (FIGS. 11 to 16) and the sixth embodiment (FIGS. 18 to 21). Also, the plates 48, 70 in the fifth embodiment (FIGS. 11 to 16) and the sixth embodiment (FIGS. 18 to 21) may well be replaced with bit lines similar to the first bit lines 12 in the first embodiment (FIGS. 1 to 4) and the second embodiment (FIG. 6).

The invention claimed is:

1. A semiconductor storage device characterized in that:

on a top surface of a semiconductor substrate, device isolation regions each extending in one direction are formed so as to be arrayed with respect to a direction perpendicular to the one direction, and active regions each extending in the one direction are defined between neighboring ones of the device isolation regions, respectively;

dopant diffusion regions each serving as a source region or drain region are formed within the active regions, and channel regions are defined between neighboring ones of the dopant diffusion regions within identical active regions, respectively;

on the semiconductor substrate, word lines extending in intersection with the one direction are provided so as to run on the channel regions provided within the active regions; and on the semiconductor substrate, a plurality of bit lines extending in the one direction are provided so as to run on the dopant diffusion regions, and are also connected to some of the dopant diffusion regions present thereunder via contact holes, respectively, and wherein each of the plurality of bit lines passes over adjacent dopant diffusion regions and is connected only to alternate ones of the adjacent dopant diffusion regions present thereunder via contact holes, respectively, the contact holes of one bit line being offset from the contact holes of adjacent bit lines in the one direction; and plate electrodes extending beneath bit lines and parallel to the word lines are connected to dopant diffusion regions to which the plurality of bit lines are not connected, and wherein a film having memory function is present on a side wall of a gate electrode forming part of one of the word lines.

2. The semiconductor storage device according to claim 1, wherein the film having memory function is a dielectric film containing fine particles formed of a semiconductor or conductor in a dot form.

3. The semiconductor storage device according to claim 1, wherein the film having memory function is so structured that a silicon nitride film is sandwiched by silicon oxide films.

4. The semiconductor storage device according to claim 1, wherein the film having memory function is so structured that a silicon film is sandwiched by silicon oxide films.

5. The semiconductor storage device according to claim 4, wherein the silicon film is formed of polysilicon.

* * * * *